United States Patent
Whetsel

(10) Patent No.: US 9,411,011 B2
(45) Date of Patent: Aug. 9, 2016

(54) TEST MESSAGING DEMODULATE AND MODULATE ON SEPARATE POWER PADS

(71) Applicant: Texas Instruments Incorporated, Dallas, TX (US)

(72) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/599,849

(22) Filed: Jan. 19, 2015

(65) Prior Publication Data

US 2015/0130485 A1     May 14, 2015

Related U.S. Application Data

(62) Division of application No. 13/941,844, filed on Jul. 15, 2013, now Pat. No. 8,972,809, which is a division of application No. 12/955,513, filed on Nov. 29, 2010, now abandoned, which is a division of application No. 12/434,312, filed on May 1, 2009, now Pat. No. 7,863,919, which is a division of application No. 11/854,327, filed on Sep. 12, 2007, now Pat. No. 7,546,501.

(60) Provisional application No. 60/825,476, filed on Sep. 13, 2006, provisional application No. 60/825,481, filed on Sep. 13, 2006, provisional application No. 60/825,488, filed on Sep. 13, 2006.

(51) Int. Cl.
*G01R 31/28* (2006.01)
*G01R 31/319* (2006.01)

(52) U.S. Cl.
CPC ........ *G01R 31/2851* (2013.01); *G01R 31/2884* (2013.01); *G01R 31/31917* (2013.01); *G01R 31/31919* (2013.01)

(58) Field of Classification Search
CPC ........... G01R 31/2851; G01R 31/2884; G01R 31/31917; G01R 31/31919
USPC .......................................... 714/724; 324/762
See application file for complete search history.

(56) References Cited

U.S. PATENT DOCUMENTS

| 5,727,025 | A | * | 3/1998 | Maryanka | ...................... 375/257 |
| 5,994,915 | A | * | 11/1999 | Farnworth et al. | ....... 324/750.16 |
| 6,948,098 | B2 | * | 9/2005 | Pillay et al. | ...................... 714/34 |
| 7,010,050 | B2 | * | 3/2006 | Maryanka | ...................... 375/261 |
| 8,028,208 | B2 | * | 9/2011 | Moore | .......................... 714/724 |
| 2005/0138499 | A1 | * | 6/2005 | Pileggi et al. | .................. 714/724 |

OTHER PUBLICATIONS

Weize Xu; Friedman, E.G., "On-chip test circuit for measuring substrate and line-to-line coupling noise," Solid-State Circuits, IEEE Journal of, vol. 41, No. 2, pp. 474,482, Feb. 2006.*

* cited by examiner

*Primary Examiner* — Cynthia Britt

(74) *Attorney, Agent, or Firm* — Lawrence J. Bassuk; Frank D. Cimino

(57) ABSTRACT

The present disclosure describes a novel method and apparatus for using a device's power and ground terminals as a test and/or debug interface for the device. According to the present disclosure, messages are modulated over DC voltages applied to the power terminals of a device to input test/debug messages to the device and output test/debug messages from the device. The present disclosure advantageously allows a device to be tested and/or debugged without the device having any shared or dedicated test or debug interface terminals.

3 Claims, 29 Drawing Sheets

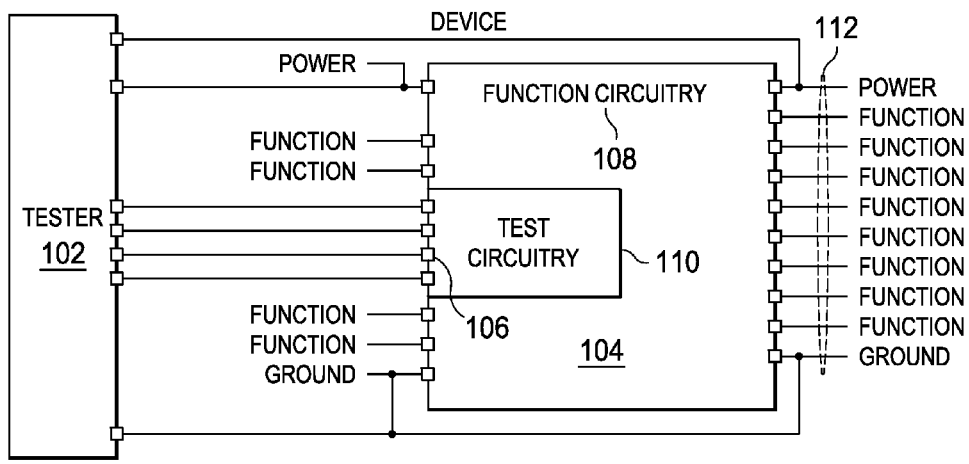
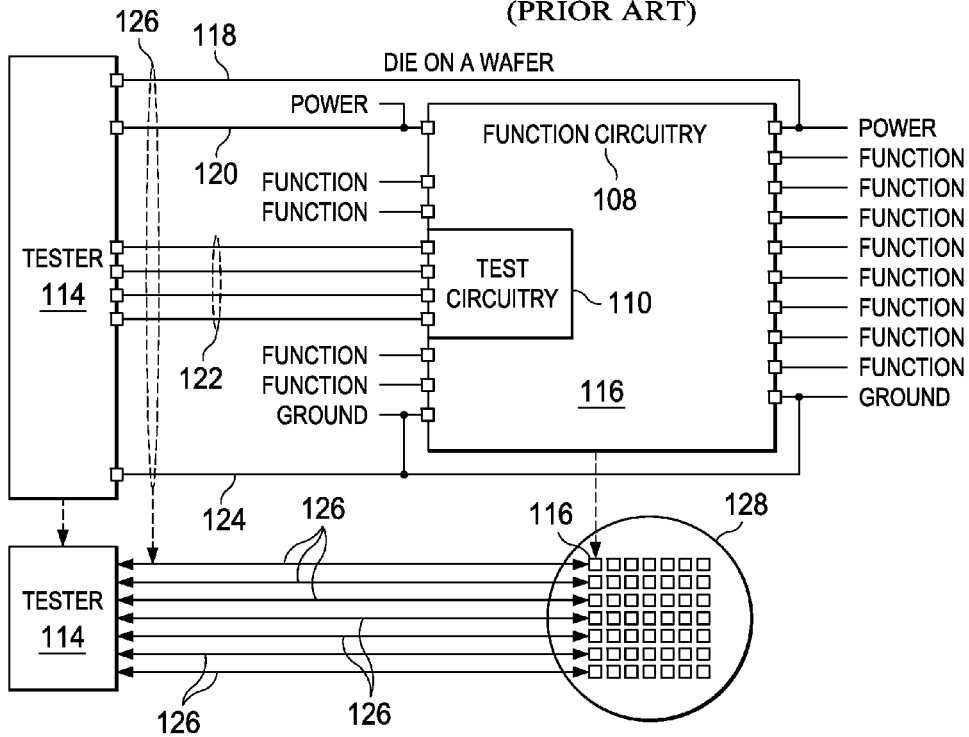

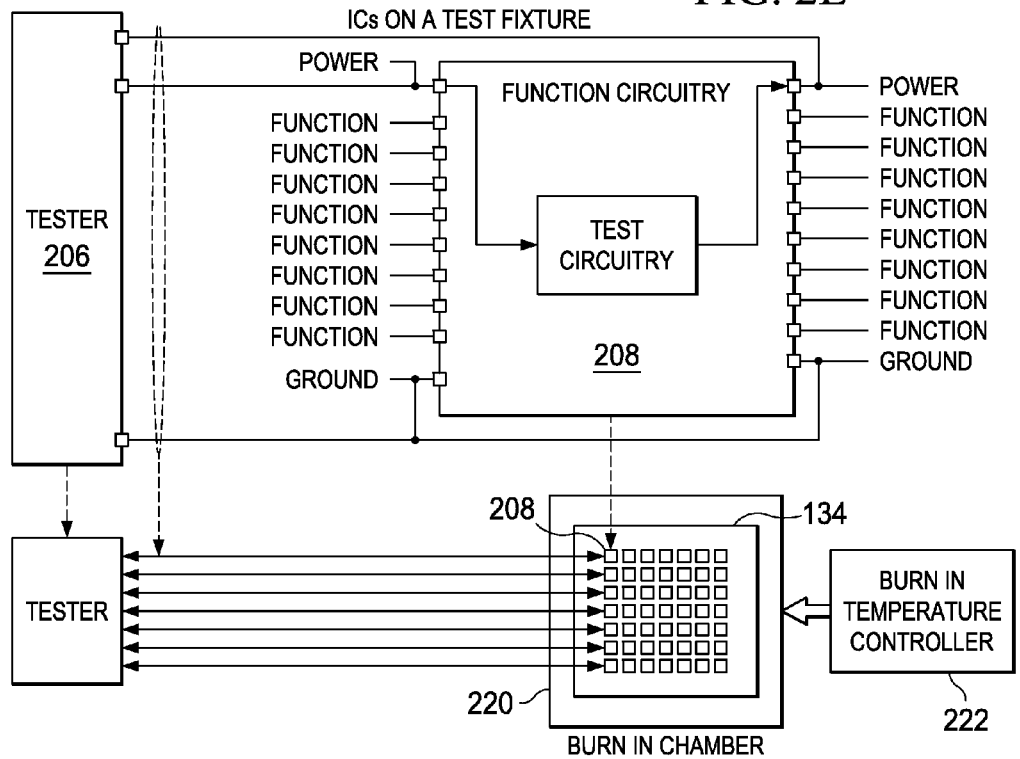
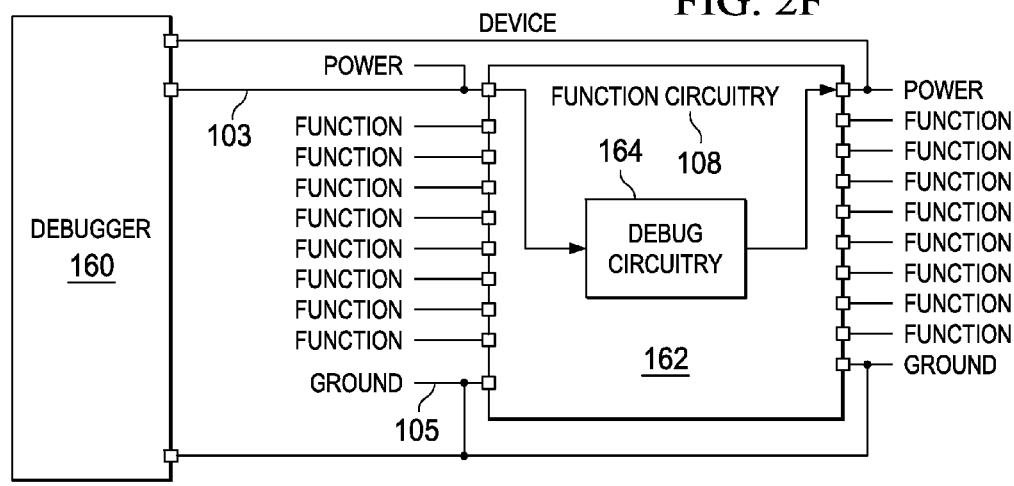

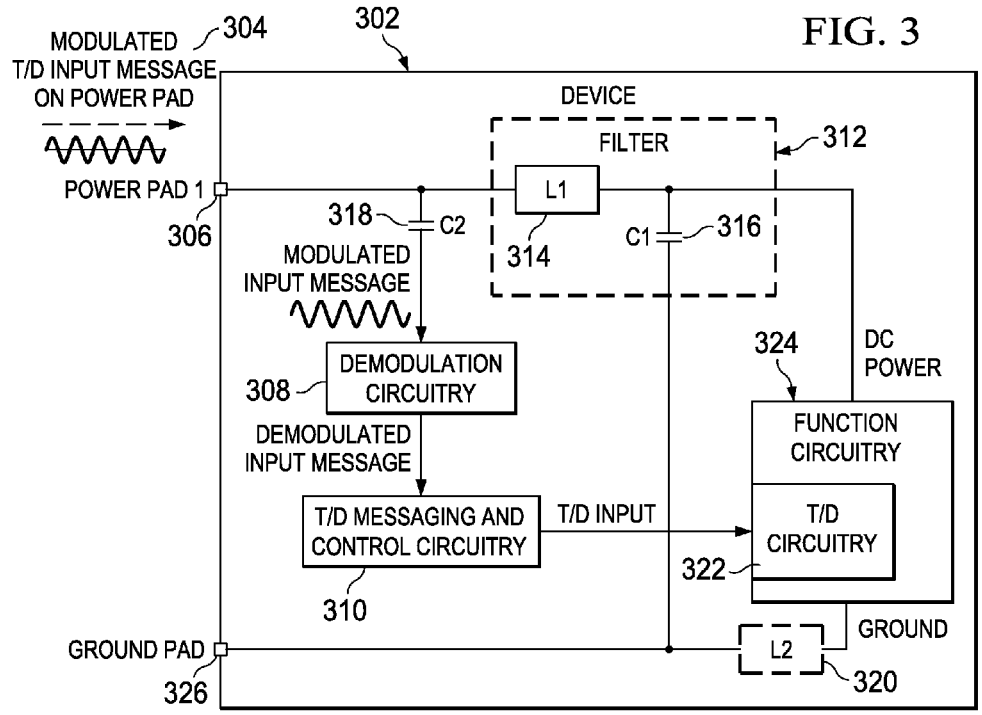
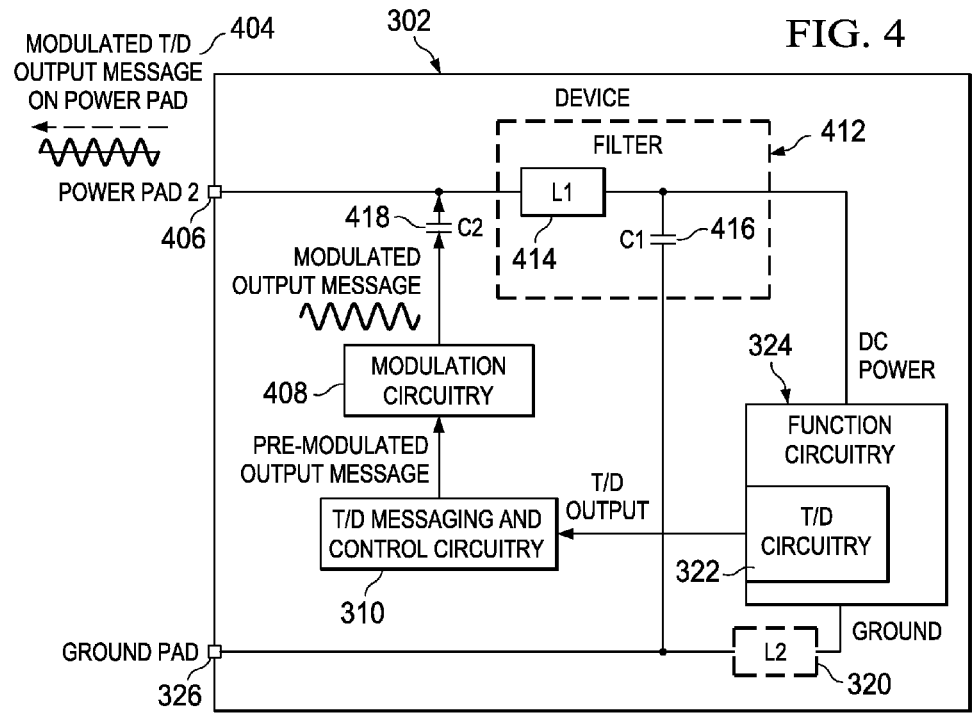

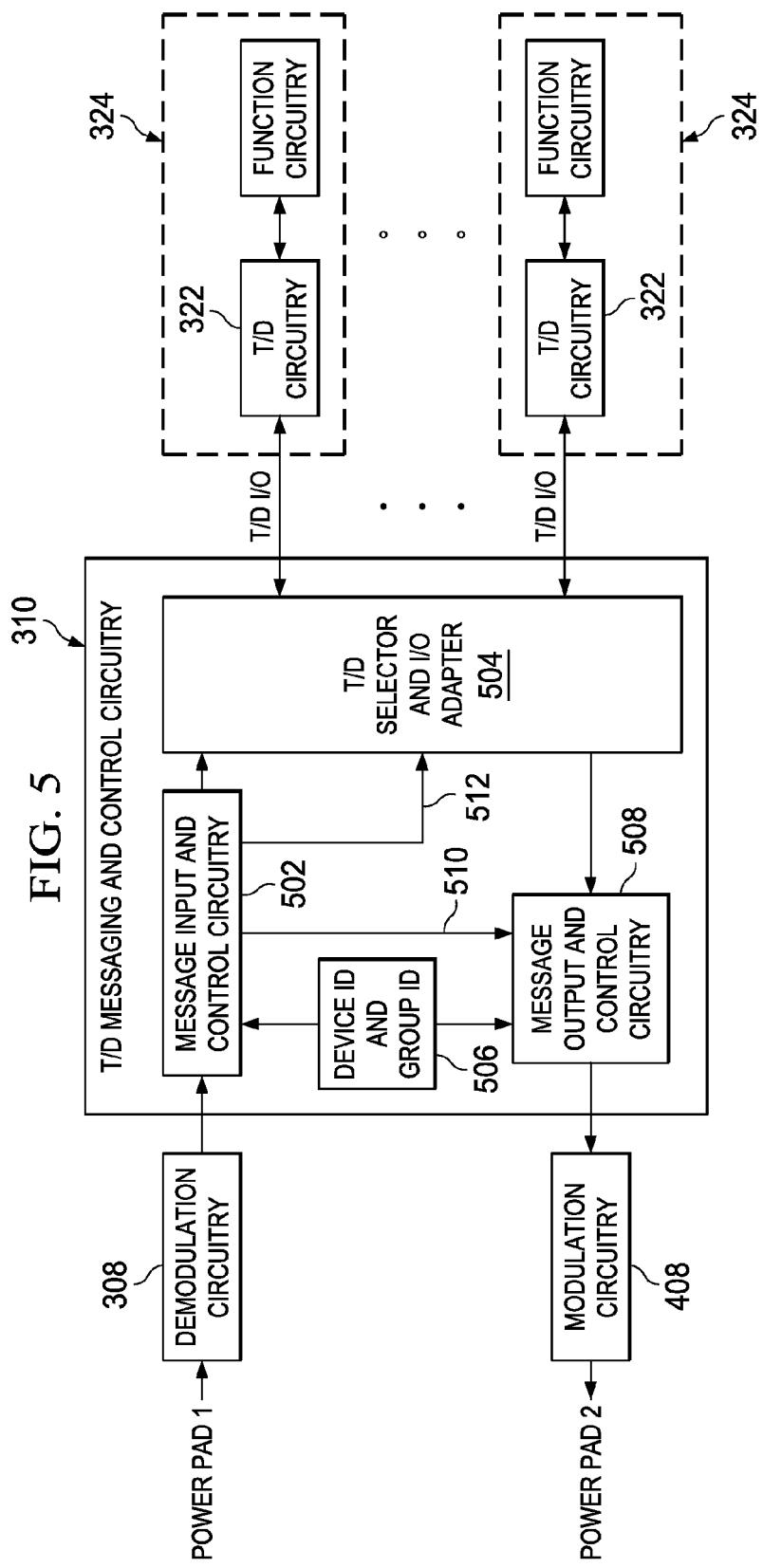

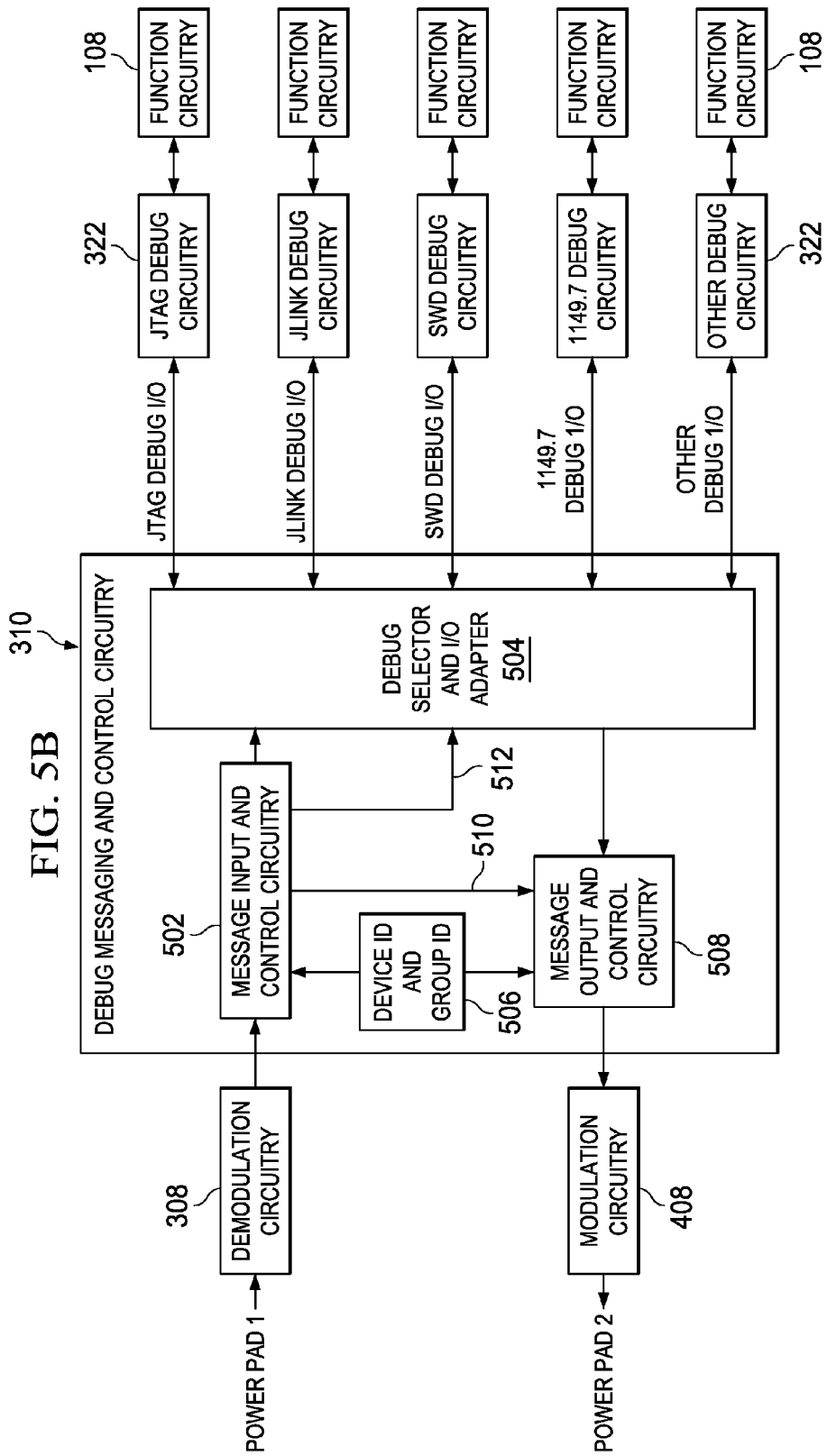

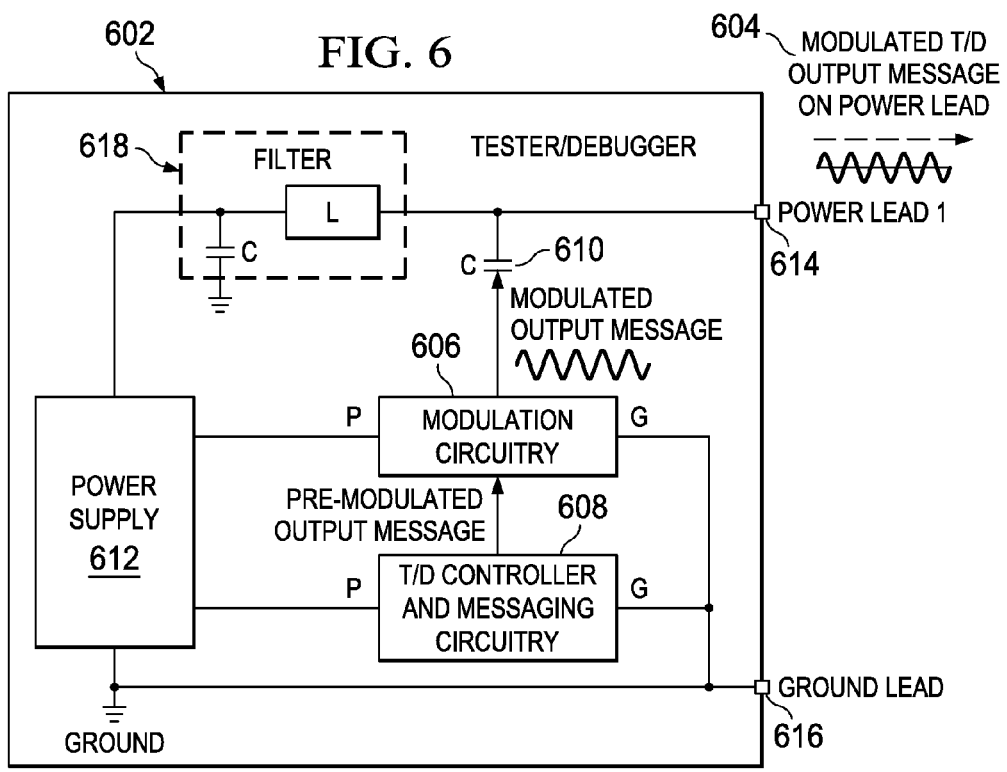
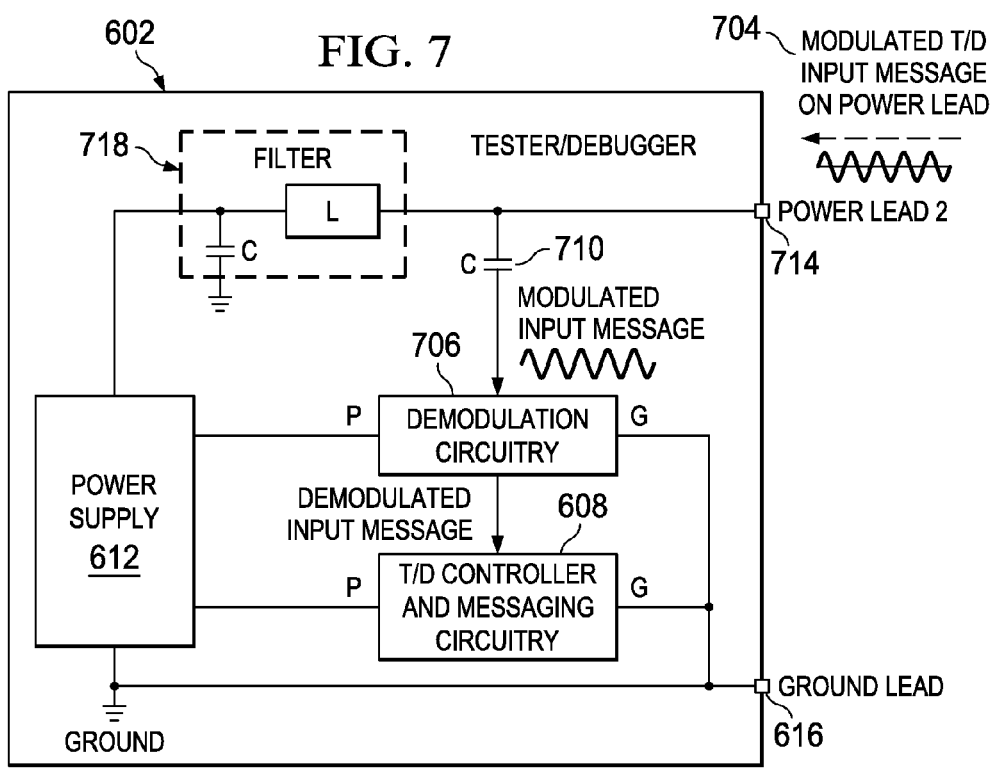

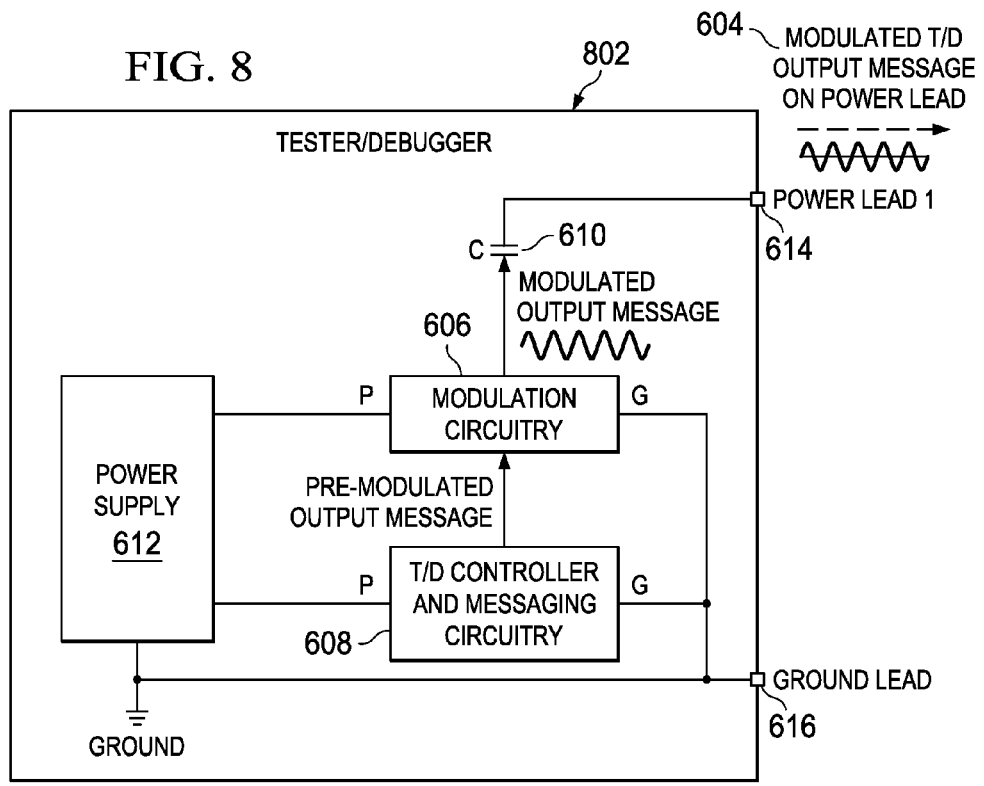
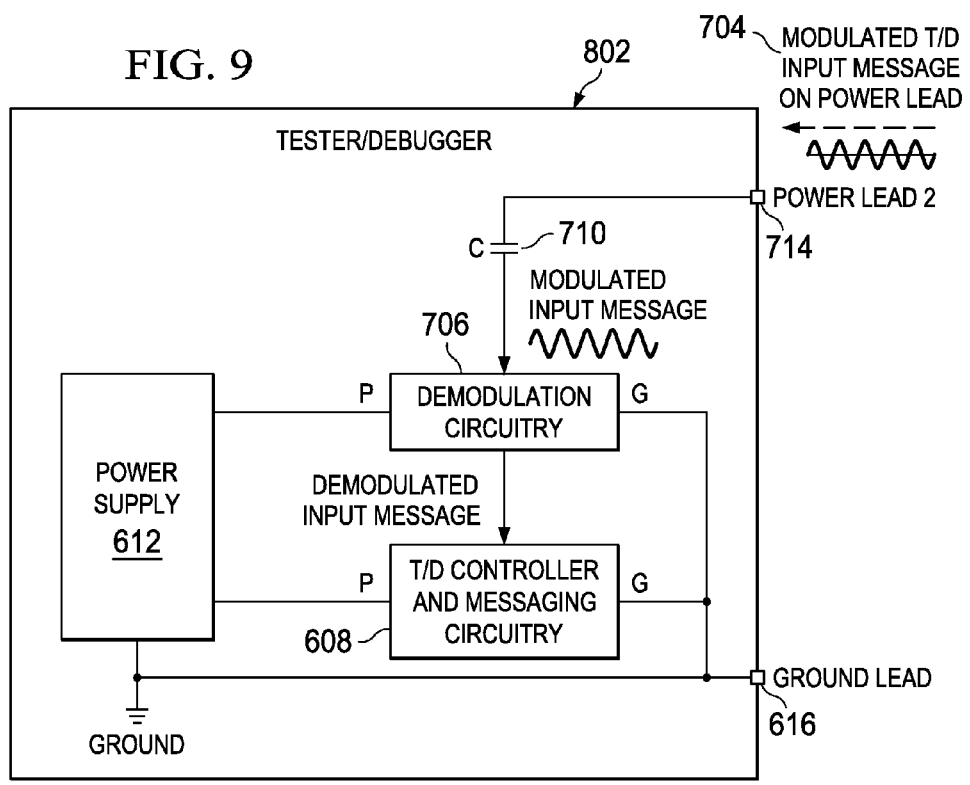

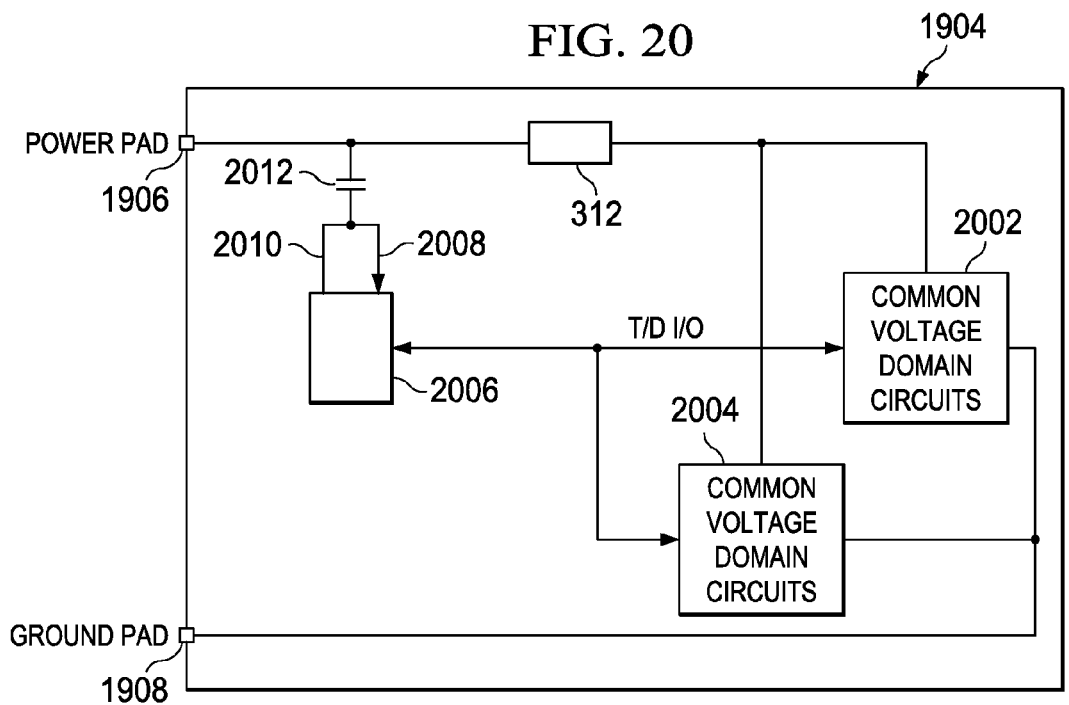
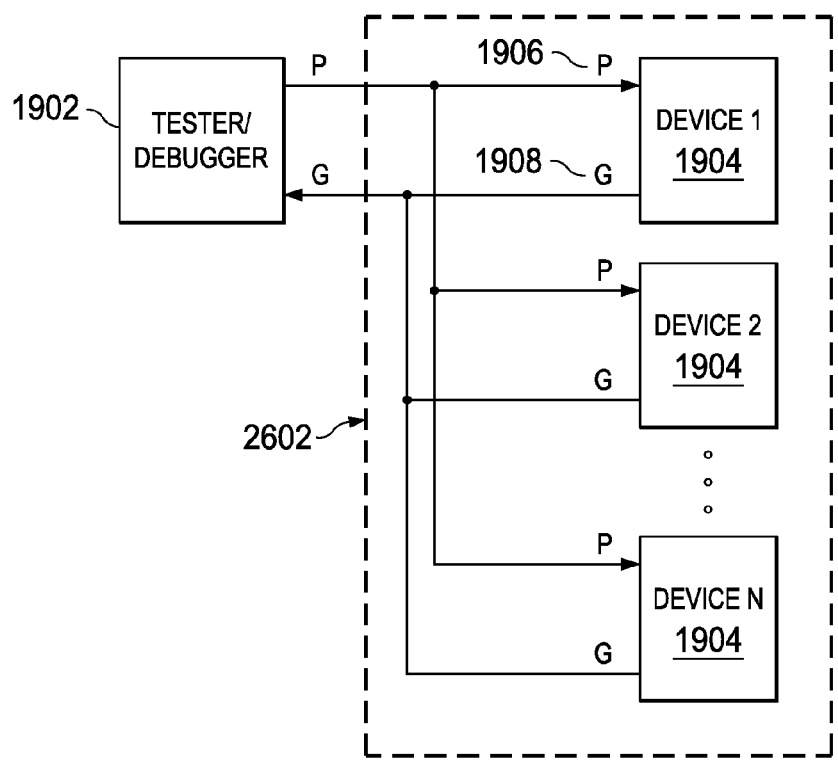

TEST MESSAGING DEMODULATE AND MODULATE ON SEPARATE POWER PADS

CROSS REFERENCE TO RELATED PATENTS

This application is a divisional of prior application Ser. No. 13/941,844, filed Jul. 15, 2013, now U.S. Pat. No. 8,972,809, issued Mar. 3, 2015;

Which was a divisional of prior application Ser. No. 12/955,513, filed Nov. 29, 2010, now abandoned;

Which was a divisional of prior application Ser. No. 12/434,312, filed May 1, 2009, now U.S. Pat. No. 7,863,919, granted Jan. 4, 2011;

Which was a divisional of prior application Ser. No. 11/854,327, filed Sep. 12, 2007, now U.S. Pat. No. 7,546,501, granted Jun. 9, 2009;

Which claims priority from Provisional Application No. 60/825,476, filed Sep. 13, 2006;

And claims priority from Provisional Application No. 60/825,481, filed Sep. 13, 2006;

And claims priority from Provisional Application No. 60/825,488, filed Sep. 13, 2006.

FIELD

This disclosure relates in general to device test and debug and in particular to device test and debug using messages transmitted over the device power and ground terminals.

BACKGROUND

Complex electrical devices, which may be die, packaged ICs, or embedded cores within die or ICs, require test interfaces to allow testing of the device's hardware design. Further, these complex devices require debug interfaces to allow debugging of the devices hardware and software designs. These device test and debug interfaces require using some of the device's I/O terminals. For example, IEEE 1149.1 JTAG based test and debug of devices require dedicating four or five of a device's I/O terminals for use as a test and debug interface. Allocating device I/O terminals for test and debug interfaces eliminates those I/O terminals from being used as functional terminals.

Today very complex devices are being placed in smaller and smaller packages to allow more devices to be placed on tiny substrates, such as the miniature substrates used in cell phones. Small device packages typically have a reduced number of device I/O terminals, which creates competition between device terminals used for functionality and device terminals used for test and debug.

As a result of this competition for device terminal use, newer device test interfaces, such as the recently initiated IEEE P1149.7 standard, are being developed to reduce the number of device terminals required for test. While the IEEE P1149.7 standard provides a two terminal device test interface, even that smaller test interface will not offset future competition for functional and test/debug use of device terminals as package sizes continue to decrease. Ideally, and according to the present disclosure, device test and debug should be done without requiring dedicated use of any device terminals.

FIG. 1A illustrates an example of external test equipment 102, referred to hereafter as Tester, being coupled to the power 103, ground 105, and test terminals 106 of a device 104. Internal to the device 104, functional circuitry 108 and test circuitry 110 exists. The functional circuitry is coupled to functional terminals 112 and provides the functionality of the device. The test circuitry is coupled to test terminals 106 and provides the testing features of the device. Inside the device, the test circuitry interfaces to the functional circuitry to allow the functional circuitry to be tested.

Device test techniques include but are limited to; (1) internal scan testing whereby functional registers are converted into scan registers to allow shifting test patterns in and out of the device to test the combination circuitry of the function circuitry, (2) JTAG boundary scan testing whereby scan cells at the device boundary are used to test the device, (3) built in self testing (BIST) whereby internal test pattern generators and test pattern compactors are enabled to test combinational logic of the function circuitry, (4) built in test (BIT) whereby test code stored in non-volatile memory of the device is enabled to test the device, and (5) functional testing whereby a test code is uploaded into a memory of the device and executed to test the functionality of the device.

The Tester to device interface model shown in FIG. 1A is widely used today. This model uses dedicated device test terminals 106 which allows a device to be tested in a factory (manufacturing) or field (application) environment. Typically today, the Tester is interfaced to the device test circuitry using a dedicated IEEE standard 1149.1 (JTAG) test interface. However, other types of dedicated device test interfaces exists, such as but not limited to the IEEE standard 1149.4 test interface and the developing IEEE standard 1149.7 test interface bus. As long as the device has enough terminals, dedicated test signals can be used. However, in some cases (i.e. reduced pin count ICs) a device may not have enough terminals for both functional and test signals. In this case, dedicated device test terminals may not be available and device testing must be achieved by sharing terminals between functional and test use. Having to share device terminals for functional and test use eliminates the advantage of using the above mentioned IEEE standard test interfaces.

FIG. 1B illustrates an example of a wafer tester 114 contacting a die 116 on a wafer 128 for testing. The contact bus 126 between the tester and die includes; power contact signals 118-120 for powering up the die, test contact signals 122 for sending test inputs to and receiving test outputs from the die, and ground contact signals 124. The test contact signals 122 may be dedicated test pads of the die as mentioned in FIG. 1A, or functional pads that during test are converted into test pads (i.e. shared pads), or a mixture of dedicated and shared pads.

To reduce test time, and therefore test cost, it is advantageous to contact and simultaneously test as many die on a wafer as possible. This requires that the tester has a number of contact busses 126 equal to the number of die to be contacted and simultaneously tested. The cost of a tester grows as the number of contact signals in the contact bus 126 grow. In the industry today low cost wafer testers are being used to test multiple die on wafer. Reducing the number of contact signals in the contact bus 126 is one of the key ways to reduce the cost of a tester. Since the number of power 118-120 and ground 124 contact signals between a tester and die typically cannot be reduced due to the power a die consumes during test, the test input and output contact signals 122 are the ones usually targeted for reduction. The reduction of test input and output signals 122 is achieved by increasing the capability of the test circuitry 106 within the die 116.

FIG. 1C illustrates an example of an IC tester 130 contacting an IC 132 on a test fixture 134 for testing using a contact bus 136. For the sake of simplicity it is assumed that the IC tester 130 is the same as the wafer tester 114, the IC 130 is a packaged die 116, and the IC test contact bus 136 is the same as the die contact bus 126 of FIG. 1B. Also the test contact signals 122 may be dedicated, shared, or a mixture of dedicated and shared signals.

For the same reasons mentioned in regard to FIG. 1B, it is advantageous, cost-wise, to contact and simultaneously test as many ICs on the fixture as possible, which requires a number of contact busses 136 equal to the number of ICs to be contacted and simultaneously tested. Also, for the reasons mentioned in regard to FIG. 1B, it is advantageous to use low cost testers to test the ICs on the fixture, which requires reducing the number of test contacts 122 between the tester and ICs.

FIG. 1D illustrates the die on wafer testing of FIG. 1B as it would occur in a burn in chamber 138 whose temperature is controlled by a burn in temperature controller 140.

FIG. 1E illustrates the IC in fixture testing of FIG. 1C as it would occur in a burn in chamber 142 whose temperature is controlled by a burn in temperature controller 144.

FIG. 1F illustrates an example of external debug equipment 150, referred to hereafter as Debugger, being coupled to the debug the terminals 156 of a device 152. Internal to the device 152, functional circuitry 108 and debug circuitry 154 exist. The functional circuitry is coupled to functional terminals 112 and provides the functionality of the device. The debug circuitry is coupled to debug terminals 156 and provides the debugging features of the device. Inside the device, the debug circuitry interfaces to the functional circuitry to allow the operation of the functional circuitry and the controlling software to be debugged.

Device debug techniques include but are not limited to the following type of operations. (1) Uploading software into the memory of the functional circuitry for execution during software development and debug. (2) Loading breakpoint patterns into debug registers/memories coupled, via comparator circuits, to the address and/or data busses of the functional circuitry to allow triggering a debug operation to occur in response to a match between the breakpoint patterns and patterns occurring on the address and/or data busses during functional operation of the device. (3) Halting the functional operation of the device in response to the occurrence of a breakpoint trigger to allow upload and/or download of functional software or debug information. (4) Performing a trace operation whereby functionally occurring address and/or data bus patterns are stored in a trace buffer memory in the debug circuitry in response to a breakpoint trigger. (5) Performing a trace buffer output operation whereby functional address and/or data bus patterns stored in the trace buffer memory are output from the device to the debugger in response to a debug command input or in response to the occurrence of a breakpoint trigger. (6) Performing real-time trace output of address and/or data patterns occurring in the device during normal device operation.

The debugger to device interface model shown in FIG. 1F is widely used today. The key advantage of this model is the use of dedicated device debug terminals which allow debug operations to occur while the device is in functional operation mode. Typically today, the debugger is interfaced to the device debug circuitry using a JTAG interface. However, other types of debugger to device interfaces exists, such as ARM's single wire debug (SWD) interface bus, Debug Innovation's J-Link (JUNK) interface bus, and the developing IEEE 1149.7 test/debug interface bus. Regardless of the type of debug interface used, all state of the art device debugging done today make use of dedicated debug terminals on the device to allow debug to occur coincident with the functional operation of the device.

The present disclosure, as will be described in detail below, allows device testing and/or debugging to occur without requiring use of any device terminals, other than the device power and ground terminals. Therefore the present disclosure advantageously enables; (1) all device terminals to be used for functionality to support reduced pin count IC packaging, (2) use of IEEE test standards without requiring dedicated test terminals on the device, and (3) lower cost testers since the contact bus between a tester and a device only includes the device's power and ground signals.

SUMMARY

The present disclosure provides a novel method and apparatus of communicating test or debug information between a Tester/Debugger and device using only the device's power and ground terminals.

BRIEF DESCRIPTION OF THE VIEWS OF THE DRAWINGS

FIG. 1A illustrates a test interface arrangement between a Tester and a Device.

FIG. 1B illustrates a test interface arrangement between a Tester and die on wafer.

FIG. 2E illustrates a test interface arrangement between a Tester and IC on a test fixture within a burn in chamber according to the present disclosure.

FIG. 2F illustrates a debug interface arrangement between a Debugger and Device according to the present disclosure.

FIG. 3 illustrates circuitry in a device for receiving a modulated test/debug input message according to the present disclosure.

FIG. 4 illustrates circuitry in a device for transmitting a modulated test/debug input message according to the present disclosure.

FIG. 5 illustrates Test/Debug (T/D) Messaging & Control Circuitry for communicating to Test/Debug Circuits in a device according to the present disclosure.

FIG. 5B illustrates Debug Messaging & Control Circuitry for communicating to JTAG I/O, JLINK I/O, SWD I/O, 1149.7 I/O, and/or Other types of Debug I/O Circuits in a device according to the present disclosure.

FIG. 6 illustrates circuitry in a Tester/Debugger for transmitting a modulated test/debug output message according to the present disclosure.

FIG. 7 illustrates circuitry in a Tester/Debugger for receiving a modulated test/debug input message according to the present disclosure.

FIG. 8 illustrates alternate circuitry in a Tester/Debugger for transmitting a modulated test/debug output message according to the present disclosure.

FIG. 9 illustrates alternate circuitry in a Tester/Debugger for receiving a modulated test/debug input message according to the present disclosure.

FIG. 20 illustrates a device having a single power pad coupled to test/debug messaging circuitry according to the present disclosure.

FIG. 26 illustrates a Tester/Debugger connected to plural devices via power and ground pads according to the present disclosure.

DETAILED DESCRIPTION

Figure 1C:
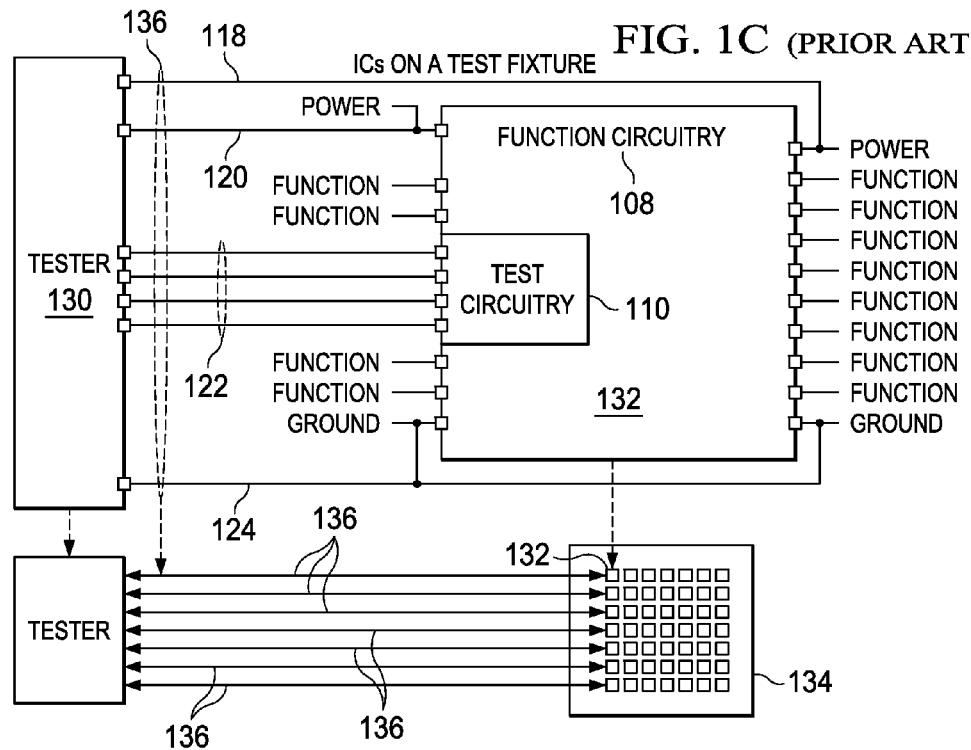
FIG. 1C illustrates a test interface arrangement between a Tester and ICs on a test fixture.
Figure 1D:
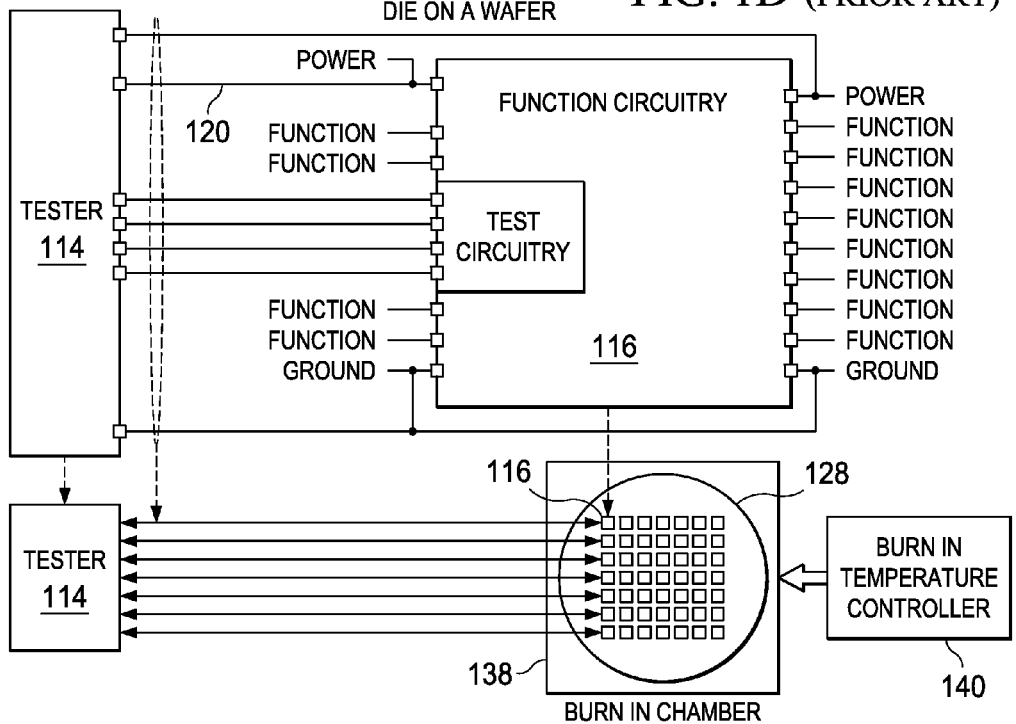
FIG. 1D illustrates a test interface arrangement between a Tester and die on wafer within a burn in chamber.
Figure 1E:
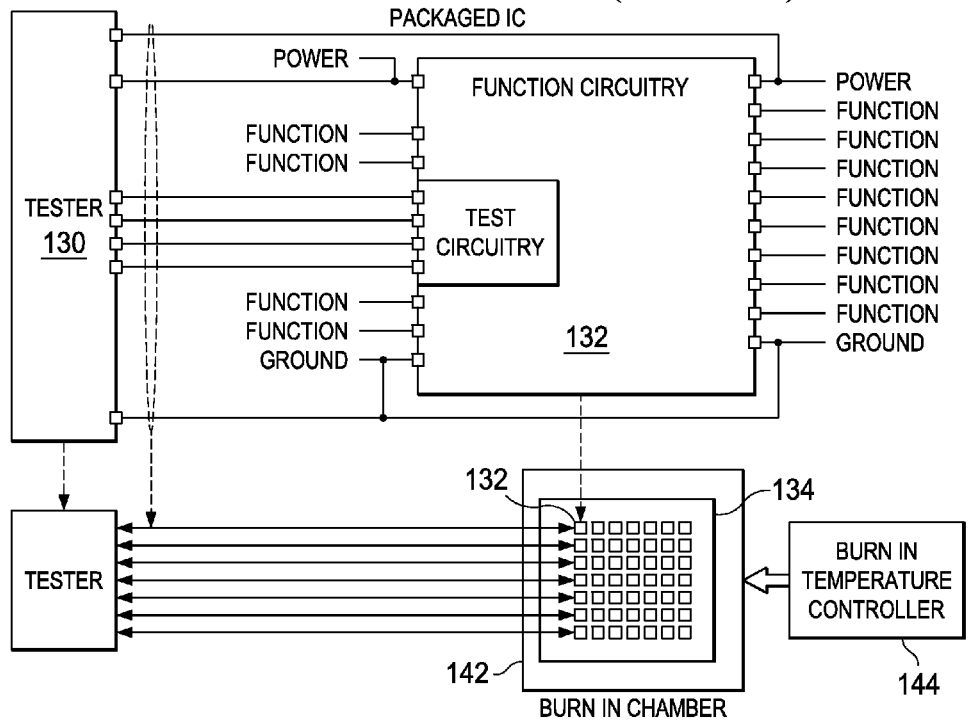
FIG. 1E illustrates a test interface arrangement between a Tester and ICs on a test fixture within a burn in chamber.
Figure 2A:
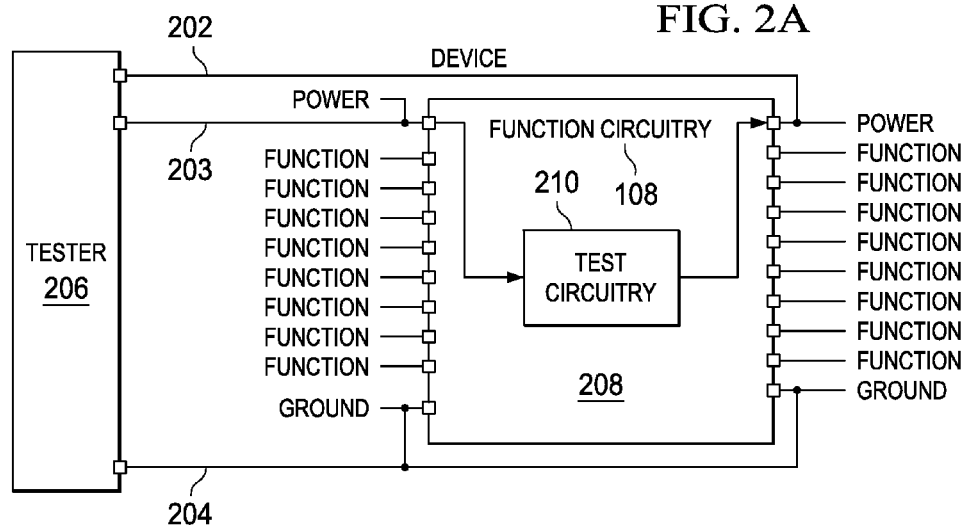
FIG. 2A illustrates a test interface arrangement between a Tester and a Device according to the present disclosure.

FIG. 2A illustrates the concept of the present disclosure in a test application. The concept is based on using only a device's power 202 and ground 204 terminals for providing test communication between a tester 206 and a device 208, each being adapted for such communication. The test communication is achieved by modulating test messages over the DC power busses of the device. By modulating test messages over the DC power buses, test circuitry 210 within the device can be accessed and controlled to execute the device test operations previously described in regard to FIG. 1A. As can be seen, the device test technique of FIG. 2A differs from the device test technique of FIG. 1A in that it does not require dedicated device test terminals. Thus using the test technique of FIG. 2A allows all of the device terminals to be used functionally and enables the device to use the previously mentioned IEEE standard test approaches without the need for dedicated device test terminals.

The concept of modulating messages over DC power is not new. U.S. Pat. No. 5,727,025 describes modulating messages over DC power busses coupled to subsystems of a system for transferring voice, music, video, and data information. U.S. Pat. No. 7,010,050 describes various modulation techniques that can be used to modulate signals over DC busses, including the use of binary phase shift keying, quadrature phase keying, amplitude modulation, frequency modulation, and code division multiple access. The present disclosure incorporates all the teachings of DC power bus modulation provided in the above referenced US patents to achieve a DC power bus modulation scheme that allows device test and debug operations to occur by modulating messages between a tester or debugger and a device via the device's power and ground terminals.

Figure 2B:
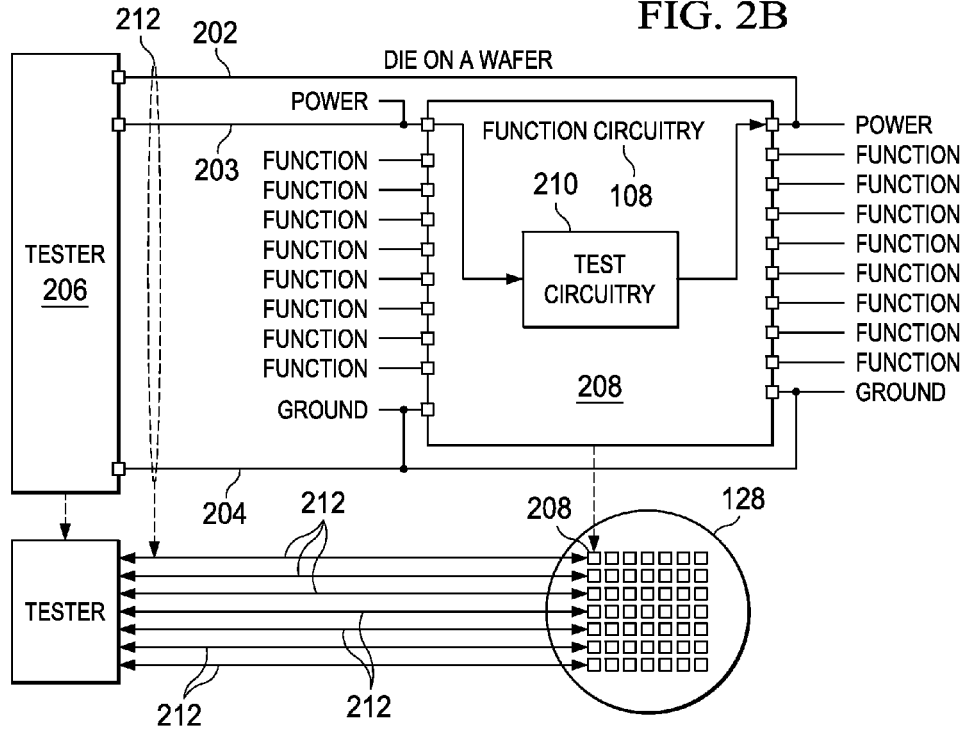
FIG. 2B illustrates a test interface arrangement between a Tester and die on wafer according to the present disclosure.

FIG. 2B illustrates a die on wafer 128 being tested by a tester. It is assumed that the die is device 208 of FIG. 2A, the Tester is Tester 206 of FIG. 2A, and the test interface consists of device power and ground terminals 202-204. As seen, each die 208 on the wafer only requires a contact bus 212 to the Tester consisting of power contact 202, power contact 203, and ground contact 204. The present disclosure therefore eliminates the test contact signals 122 from the contact bus 212 that were required in the previous contact bus 126 of FIG. 1B. By eliminating the test contact signals 122, the present disclosure reduces the size of the test contact bus 212 which enables use of lower cost wafer testers.

Figure 2C:
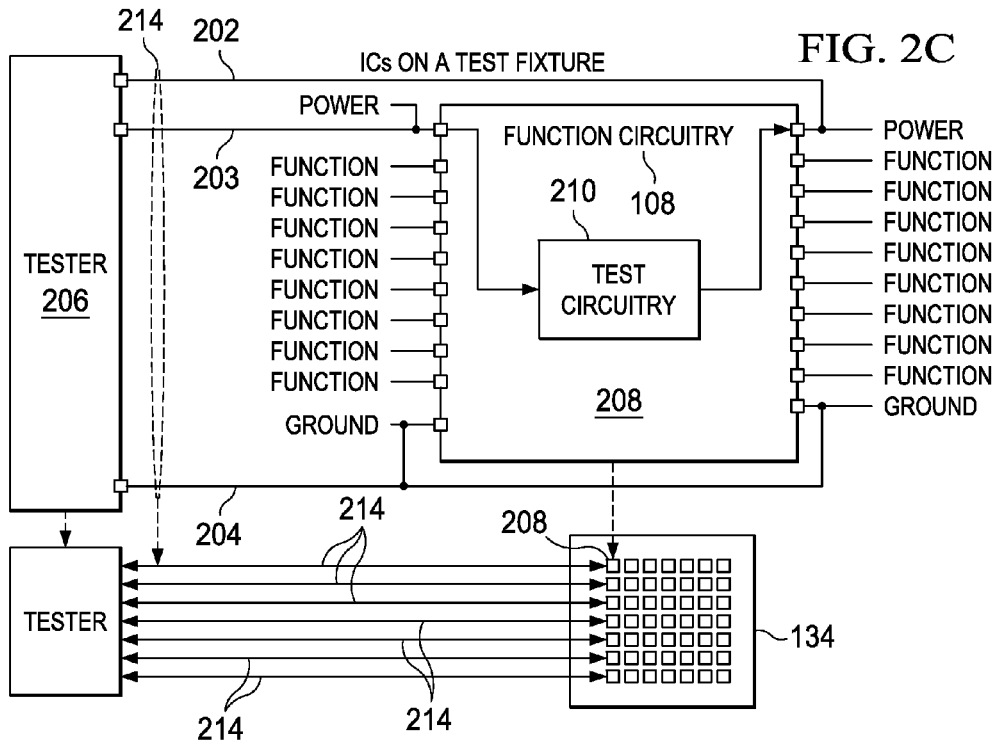
FIG. 2C illustrates a test interface arrangement between a Tester and IC on a test fixture according to the present disclosure.

FIG. 2C illustrates an IC on a test fixture 134 being tested by a tester. It is assumed that the IC is device 208 of FIG. 2A, the Tester is Tester 206 of FIG. 2A, and the test interface consists of device power and ground terminals 202-204. As seen, each IC 208 on the fixture only requires a contact bus 214 to the Tester consisting of power contact 202, power contact 203, and ground contact 204. The present disclosure therefore eliminates the test contact signals 122 from the contact bus 214 that were required in the previous contact bus 136 of FIG. 1C. By eliminating the test contact signals 122, the present disclosure reduces the size of the test contact bus 214 which enables use of lower cost IC testers.

Figure 2D:
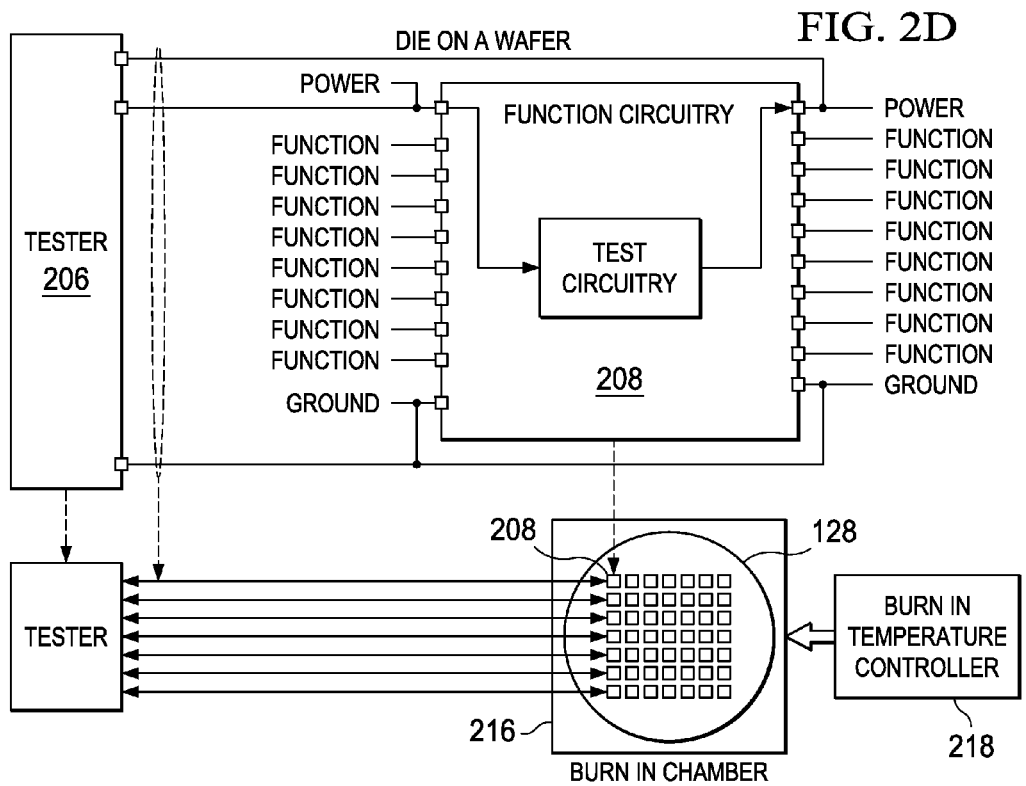
FIG. 2D illustrates a test interface arrangement between a Tester and die on wafer within a burn in chamber according to the present disclosure.

FIG. 2D illustrates the die on wafer testing of FIG. 2B as it would occur in a burn in chamber 216 whose temperature is controlled by a burn in temperature controller 218.

FIG. 2E illustrates the IC in fixture testing of FIG. 2C as it would occur in a burn in chamber 220 whose temperature is controlled by a burn in temperature controller 222.

FIG. 2F illustrates the concept of the present disclosure in a debug application. Again, the concept is based on using only a device's power 202 and ground 204 terminals for providing debug communication between a debugger 160 206 and a device 162, each being adapted for such communication. The debug communication is achieved by modulating debug messages over the DC power busses of the device. By modulating debug messages over the DC power buses, debug circuitry 164 within the device can be accessed and controlled to execute the device debug operations previously described in regard to FIG. 1F. As can be seen, the device debug technique of FIG. 2F differs from the device debug technique of FIG. 1F in that it does not require dedicated device debug terminals. Thus using the debug technique of FIG. 2F allows all of the device terminals to be used functionally and enables the device to use the previously mentioned IEEE standard approaches without the need for dedicated device debug terminals.

FIG. 3 illustrates an example implementation of circuitry within a device 302 for receiving a modulated test or debug (T/D) input message 304 from a DC power pad 306 of the device. The circuitry consists of Demodulation Circuitry 308, T/D Messaging & Control Circuitry 310, filter 312, capacitor 318, and optionally an inductor 320.

The Demodulation circuitry 308 receives the modulated input message from the power pad 306 via capacitor 318. Capacitor 318 blocks (de-couples) DC voltage from the power pad but allows the modulated message to pass from the power pad to the Demodulation circuitry. The Demodulation Circuitry demodulates the message and outputs the demodulated message to the T/D Messaging & Control Circuitry 310.

The T/D Messaging & Control Circuitry interprets the message and converts it into a T/D Input format for input to the device's T/D Circuitry 322. The format of the T/D Input to the T/D Circuitry 322 may be of any type currently known or used in the industry including but not limited to input formats compatible with the previously mentioned JTAG (IEEE 1149.1) circuitry, IEEE 1149.7 circuitry, IEEE 5001 circuitry, JUNK circuitry, SWD circuitry, IEEE 1149.4 circuitry. The input format of the T/D Input may also be a user defined input to a user defined T/D Circuit 322.

The T/D Circuitry 322 receives the T/D Input from the T/D Messaging & Control Circuitry 310 and uses the input to setup and execute any of the function circuit 108 test and debug operations mentioned previously in regard to FIGS. 1A and 1F, as well as any other T/D operations.

Filter 312 comprises an inductor 314 coupled in series between the device power pad 306 and the DC power lead of the function and T/D circuitry 324, and a capacitor 316 coupled between the DC power lead of the function and T/D circuitry 324 and the device ground pad 326. The inductor serves to block the modulated input message component from being applied to the power lead of the device function and T/D circuitry 324. The capacitor 316 serves to short any remaining component of the input message on the DC power lead of the function and T/d circuitry 324 to the device ground pad 326.

Optional inductor 320 is coupled in series between the device ground pad 326 and the ground lead of function and T/D circuitry 324. Inductor 320, if used, serves to further block any remaining modulated input message component, from capacitor 316, from being applied to the ground lead of function and T/D circuitry 324.

While not shown in this and other similar Figures, the DC power lead and ground lead to function and T/D circuitry 324 is also coupled to supply power and ground to the Demodulation Circuitry 308 and T/D Messaging & Control Circuitry 310.

FIG. 4 illustrates an example implementation of circuitry within a device 302 for transmitting a modulated T/D output message 404 from a DC power pad 406 of the device. The circuitry consists of Modulation Circuitry 408, T/D Messaging & Control Circuitry 310, filter 412, capacitor 418, and optionally inductor 320.

The Modulation circuitry 408 receives a pre-modulated output message from T/D Messaging & Control Circuitry 310 and outputs a Modulated Output Message to power pad 406 via capacitor 418. Capacitor 418 blocks (de-couples) DC voltage from the power pad but allows the modulated message to pass from the Modulation Circuitry 408 to the power pad 406.

The T/D Messaging & Control Circuitry 310 receives the T/D Output format from the T/D Circuit 322 and converts it into the pre-modulated output message sent to the Modulation Circuitry 408. The format of the T/D Output from the T/D Circuitry 322 may be of any type currently known or used in the industry including but not limited to output formats compatible with the previously mentioned JTAG (IEEE 1149.1) circuitry, IEEE 1149.7 circuitry, IEEE 5001 circuitry, JLINK circuitry, SWD circuitry, IEEE 1149.4 circuitry. The output format may also be a user defined output from a user defined T/D Circuit 322.

Figure 1F:
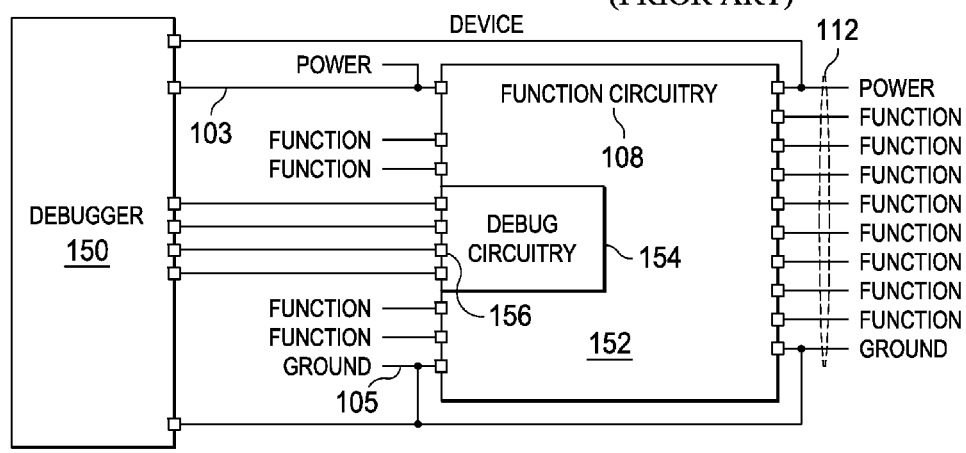
FIG. 1F illustrates a debug interface arrangement between a Debugger and a Device.

The T/D Circuitry 322 outputs the T/D Output to the T/D Messaging & Control Circuitry 310 as a result of executing any of the function circuit test and debug operations described in regard to FIGS. 1A and 1F, as well as any other T/D operations.

Filter 412 comprises an inductor 414 coupled in series between the device power pad 406 and the DC power lead of the function and T/D circuitry 324, and a capacitor 416 coupled between the DC power lead of the function and T/D circuitry 324 and the device ground pad 326. The inductor serves to block the modulated output message component from being applied to the power lead of the device function and T/D circuitry 324. The capacitor 416 serves to short any remaining component of the T/D output message on the DC power lead of the function and T/D circuitry 324 to the device ground pad 326.

Optional inductor 320 is coupled in series between the device ground pad 326 and the ground lead of function and T/D circuitry 324. Inductor 320, if used, serves to further block any remaining modulated output message component, from capacitor 416, from being applied to the ground lead of function and T/D circuitry 324.

While not shown in this and similar Figures, the DC power lead and ground lead to function and T/D circuitry 324 is also coupled to supply power and ground to the Modulation Circuitry 408 and T/D Messaging & Control Circuitry 310.

FIG. 5 illustrates one example implementation of the T/D Messaging & Control Circuitry 310. The T/D Messaging & Control Circuitry comprises Message Input & Control Circuitry 502, T/D Selector & Input/Output (I/O) Adapter 504, Device & Group Identification (ID) circuitry 506, and Message Output & Control Circuitry 508. The Device ID & Group ID circuit provides identification pattern inputs to the Message Input & Control Circuitry 502 to allow accessing a single device using the Device ID pattern, or accessing a group of Devices using the Group ID pattern. A description of using Device and Group IDs in messages to access devices will be given in regard to FIGS. 12-17 and 27.

The Message Input & Control Circuitry 502 receives and interprets the Demodulated Input Message from the Demodulation Circuitry 308. If the message is for performing a T/D Input to a selected T/D est Circuit 322, the Message Input & Control Circuitry 502 enables the T/D Selector & I/O Adapter 504, via signal 512, and outputs control to the T/D Selector & I/O Adapter 504 to select the T/D Circuit 322 and start the T/D Input operation. If the message is for performing a T/D Output from a selected T/D Circuit 322, the Message Input & Control Circuitry 502 outputs control to select the T/D Circuit, a signal 512 to enable T/D Selector & I/O Adapter 504, and a signal 510 to enable the Message Output & Control Circuitry 508. When enabled the T/D Selector & I/O Adapter 504 receives the T/D Output from the selected T/D Circuitry 322 and forwards it to the Message Output & Control Circuit 508. The Message Output & Control Circuit translates the T/D Output into the pre-modulation message format and forwards it to the Modulation Circuitry 408 to be output on a power pad. If the message is for performing a T/D Input to a selected T/D Circuitry 322 and a T/D Output from a selected T/D Circuitry 322, the above described T/D Input and T/D Output operations occur simultaneously.

While plural selectable T/D Circuits 322 are shown in FIG. 5, a single T/D Circuit 322 may be used as well. If only a single T/D Circuit 322 is used the T/D Selector & I/O Adapter may be designed to always select the single T/D Circuit.

In FIG. 5 it is seen that two power pads are used in this example, one for inputting a Modulated Input Message from a Tester or Debugger and another for outputting a Modulated Output Message to a Tester or Debugger. The use of two power pads enables the Tester or Debugger to simultaneously input messages to and output messages from the T/D Circuitry 322. As will be described later in FIG. 11, the two power pads need to be electrically isolated from one another to achieve simultaneous input and output messaging.

Figure 5A:
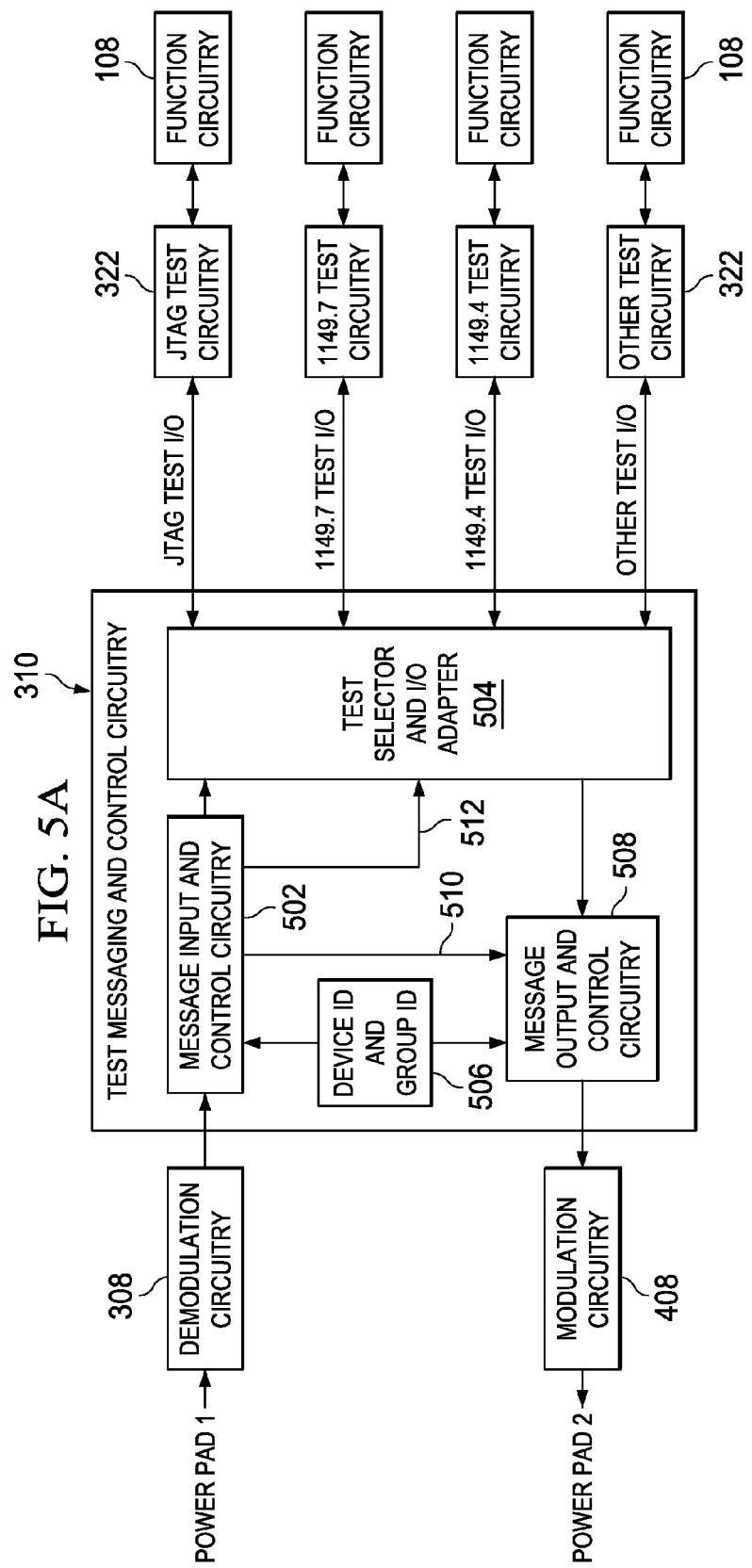
FIG. 5A illustrates Test Messaging & Control Circuitry for communicating to JTAG (i.e. 1149.1) I/O, 1149.7 I/O, 1149.4 I/O and/or Other types of Test I/O Circuits in a device according to the present disclosure.

As seen in the example test application FIG. 5A, a Test Selector & I/O Adapter 504 may be used to select and communicate with any type of Test Circuits 322 that exist in a device. If JTAG based Test Circuitry exists in the device, the Test Selector & I/O Adapter 504 can select the JTAG Test Circuitry and communicate with it using the JTAG I/O protocol. If IEEE standard 1149.7 based Test Circuitry exists in the device, the Test Selector & I/O Adapter 504 can select the 1149.7 Test Circuitry and communicate with it using the 1149.7 I/O protocol. If IEEE standard 1149.4 based Test Circuitry exists in the device, the Test Selector & I/O Adapter 504 can select the 1149.4 Test Circuitry and communicate with it using the 1149.4 I/O protocol. In general, the Test Selector & I/O Adaptor 504 can be designed to select and communicate with any type of Test Circuitry that exists in the device.

As seen in the example debug application FIG. 5B, a Debug Selector & I/O Adapter 504 may be used to select and communicate with any type of Debug Circuits 322 that exist in a device. If JTAG based Debug Circuitry exists in the device, the Debug Selector & I/O Adapter 504 can select the JTAG Debug Circuitry and communicate with it using the JTAG I/O protocol. If JLINK based Debug Circuitry exists in the device, the Debug Selector & I/O Adapter 504 can select the JLINK Debug Circuitry and communicate with it using the JLINK I/O protocol. If SWD based Debug Circuitry exists in the device, the Debug Selector & I/O Adapter 504 can select the SWD Debug Circuitry and communicate with it using the SWD I/O protocol. If IEEE standard 1149.7 based Debug Circuitry exists in the device, the Debug Selector & I/O Adapter 504 can select the 1149.7 Debug Circuitry and communicate with it using the 1149.7 I/O protocol. In general, the Debug Selector & I/O Adaptor 504 can be designed to select and communicate with any type of Debug Circuitry that exists in the device.

FIG. 6 illustrates an example implementation of circuitry within a Tester/Debugger 602 for transmitting a Modulated Output Message 604 onto a DC power pad of a device. The circuitry consists of Modulation Circuitry 606, T/D Controller & Messaging Circuitry 608, capacitor 610, a filter 618, and power supply 612. The power supply 612 supplies voltage to the Tester/Debugger circuitry of FIG. 6 and to the device being tested or debugged. The voltage supplied to the device may be the same or a different voltage than that supplied to the Tester/Debugger circuitry. As seen, the Tester/Debugger 602 has a power lead 614 and a ground lead 616. During device test/debug, the power lead 614 is connected to a power pad of the device and the ground lead 616 is connected to a ground pad of the device.

The Modulation circuitry 606 receives a Pre-modulated Output Message from T/D Controller & Messaging Circuitry 608, modulates it, and outputs the Modulated Output Message to power lead 614 via capacitor 610. Capacitor 610 blocks (de-couples) DC voltage from the power supply but allows the modulated message to pass from the Modulation Circuitry 606 to a device power pad, via a connection formed between power lead 614 and the device power pad. The filter 618 isolates the modulation from the power supply. As mentioned earlier in regard to FIG. 2A, the Modulation Circuitry 606 may use any modulation technique such as, but not limited too, binary phase shift keying, quadrature phase keying, amplitude modulation, frequency modulation, and code division multiple access, to create the Modulated Output Message.

FIG. 7 illustrates an example implementation of circuitry within Tester/Debugger 602 for receiving a Modulated Input Message 704 from a DC power pad of a device. The circuitry consists of Demodulation Circuitry 706, T/D Controller & Messaging Circuitry 608, capacitor 710, a filter 718, and power supply 612. The power supply 612 powers the Tester/Debugger circuitry of FIG. 7 and the device being tested/debugged. The voltage supplied to the device may be the same or a different voltage than that supplied to the Tester/Debugger circuitry. As seen, the Tester/Debugger 602 has a power lead 714 and a ground lead 616. During device test/debug, the power lead 714 is connected to a power pad of the device and the ground lead 616 is connected to a ground pad of the device.

The Demodulation circuitry 706 receives a Modulated Input Message from the device power pad via power lead 714 and capacitor 710, demodulates it, and outputs a Demodulated Input Message to T/D Controller & Messaging Circuitry 608. Capacitor 710 blocks (de-couples) DC voltage from the power supply but allows the modulated message to pass from device power pad to the Demodulation Circuitry 706, via a connection formed between power lead 714 and the device power pad. The filter 718 isolates the modulation from the power supply. The Demodulation Circuitry 706 may use any known demodulation technique to create the Demodulated Output Message.

The controller of the T/D Controller & Messaging Circuitry 608 of FIGS. 6 and 7 includes a processor, memory, and I/O circuitry for controlling the messaging input and output and other operations performed by tester/debugger 602.

FIG. 8 illustrates an example Tester/Debugger 802 with circuitry that supplies a modulated T/D output message 604 to a device under test via power lead 614, but does not supply power to the device being tested or debugged.

FIG. 9 illustrates an example Tester/Debugger 802 with circuitry that receives a modulated T/D input message 604 from a device being tested or debugged via power lead 714, but does not supply power to the device.

The testers/debuggers 802 of FIGS. 8 and 9 operate the same as tester/debugger 602 of FIGS. 6 and 7 with the exception of not supplying power to the device being tested or debugged. The reason for not supplying power to the device is because the device being tested/debugged is in a system and being powered by the system's power supply. To test or debug the device the tester 802 simply has to make contact to the power and ground busses connected to the device's power and ground terminals to input and/or output test/debug messages.

Figure 10:
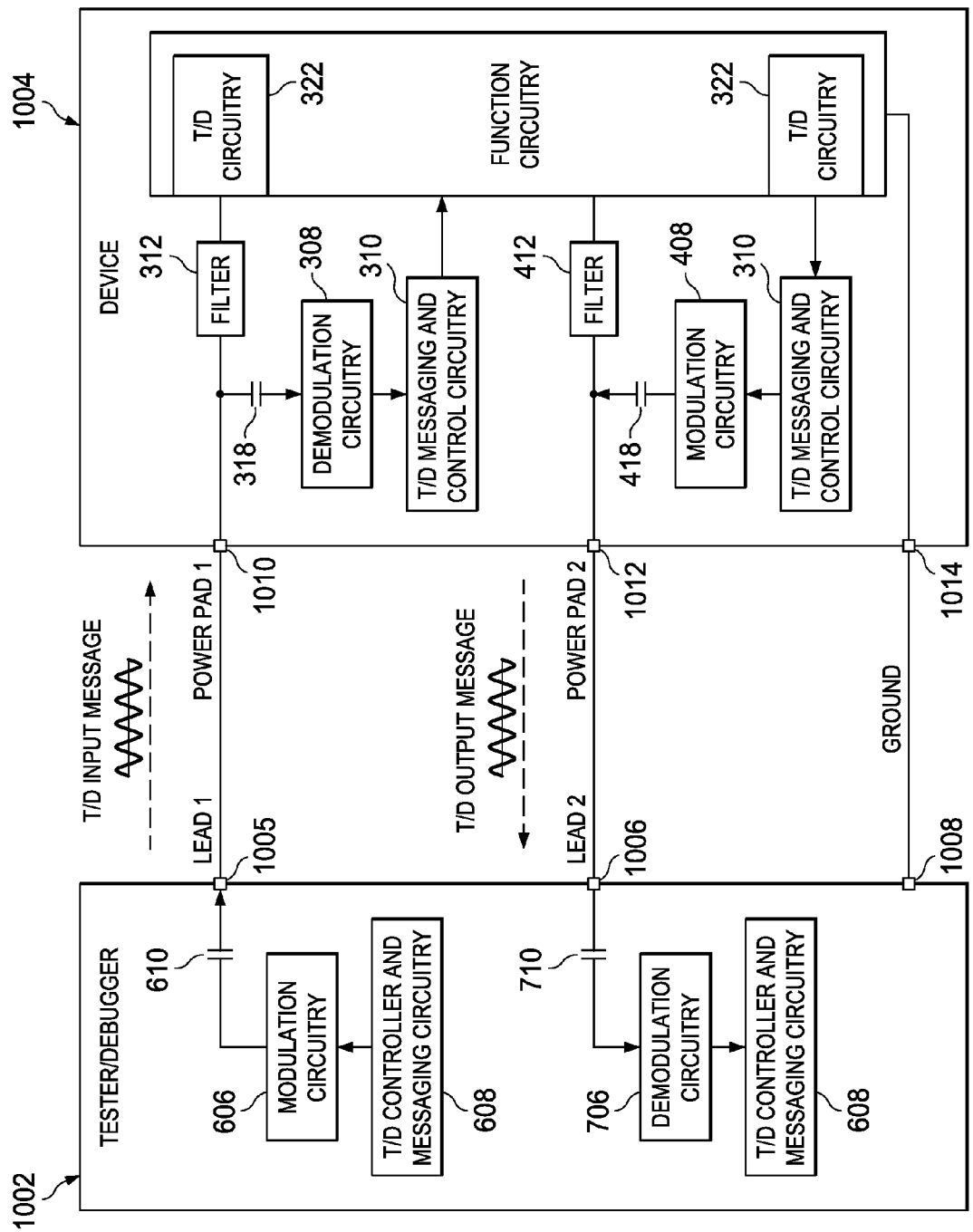
FIG. 10 illustrates the connection between a Tester/Debugger and device for communicating modulated test/debug messages according to the present disclosure.

FIG. 10 illustrates a test/debug arrangement where a Tester/Debugger 1002 is connected to a device 1004 to be tested or debugged. The Modulation Circuitry 606 of the Tester/Debugger is coupled to a device power pad 1010 via capacitor 610 and the connection between Tester/Debugger lead 1005 and device power pad 1010. The Demodulation Circuitry 706 of the Tester/Debugger is coupled to a device power pad 1012 via capacitor 710 and the connection between Tester/Debugger lead 1006 and device power pad 1012. The ground lead 1008 of the Tester/Debugger is connected to a ground pad 1014 of the device. The test/debug operation is executed by the Tester/Debugger sending and receiving modulated messages over the connections formed between the Tester/Debugger and device power pads. As can be seen, the test/debug operation does not require any functional pads of the device, just contact to the device's power and ground pads. The Tester/Debugger 1002 may supply power to device as described in the tester/debugger of FIGS. 6 and 7, or it may not supply power to the device as described in the tester/debugger of FIGS. 8 and 9.

As mentioned earlier in regard to FIG. 5, if the power pads of a device are to be used for simultaneously inputting and outputting modulated messages as shown in FIG. 10, the power pads must be electrically isolated from one another.

Figure 11:
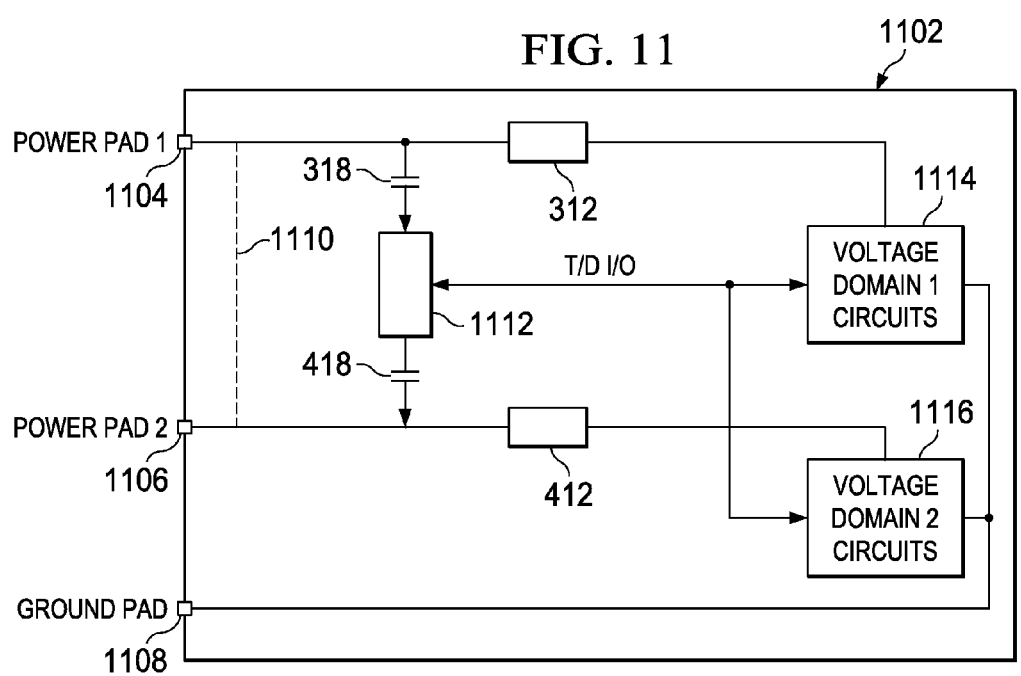
FIG. 11 illustrates a device having two power pads coupled to test/debug messaging circuitry according to the present disclosure.

FIG. 11 illustrates a device 1102 having a ground pad 1108 and power pads 1104 and 1106 which are electrically isolated and thus can be used to simultaneously communicate modulated input and output messages. Device 1102 power pads 1104 and 1106 relate to device 1004 power pads 1010 and 1012 of FIG. 10 respectively. Device 1102 ground pad 1108 relates to device 1004 ground pad 1014 of FIG. 10. Power pad 1104 provides a voltage, via the previously described filter 312, to Voltage Domain 1 Circuits 1114 and power pad 1106 provides a voltage, via the previously described filter 412, to Voltage Domain 2 Circuits 1116. Ground pad 1108 provides a ground for voltage domains 1114 and 1116. The voltage domains 1114 and 1116 may be supplied with the same or different voltages from power pads 1104 and 1106. Also, the circuits of voltage domains 1114 and 1116 may both be digital, both be analog or mixed signal, or one could be digital and the other analog or mixed signal.

Circuit 1112 of device 1102 includes the Modulation Circuitry 408, the Demodulation Circuitry 310, and the T/D Messaging & Control Circuitry 310 of FIG. 10. Power pad 1104 is coupled to Demodulation Circuitry 308 of circuit 1112, via capacitor 318, to input the modulated Input Message from a Tester/Debugger, such as Tester/Debugger 1002 of FIG. 10. Power pad 1106 is coupled to the Modulation Circuitry 408 of circuit 1112, via capacitor 418, to output the modulated Output Message to a Tester/Debugger, such as Tester/Debugger 1002 of FIG. 10. The ground pad 1108 is connected to a ground lead of a Tester/Debugger, such as Tester/Debugger 1002 of FIG. 10.

Circuit 1112 can receive a modulated Input Message from the Tester/Debugger via power pad 1104 and extract and forward the T/D Input portion of the message to a selected T/D Circuit 322 in either voltage domain 1114 or voltage domain 1116. Simultaneously, circuit 1112 can receive a T/D Output from the selected T/D Circuit 322 and transmit a modulated Output Message, including the T/D Output, to the Tester/Debugger via power pad 1106. The modulated T/D Output Message on power pad 1106 does not interfere with the modulated T/D Input Message on power pad 1104 since the power pads are not electrically connected inside the device. If the power pads were electrically connected inside the device, as indicated by dotted line 1110, the simultaneous operation of modulating a T/D Input Message on pad 1104 and a T/D Output Message on pad 1106 would not be possible, since the input and output modulations would electrically interfere with one another. It is conceivable that a modulation blocking filter could be devised an located between power pad 1104 and pad 1106 to enable modulated input and output messages to take place simultaneously. The modulation blocking filter should be designed to allow the power pads to share a common DC voltage while isolating modulated input and output messages occurring on the power pads.

Figure 12:
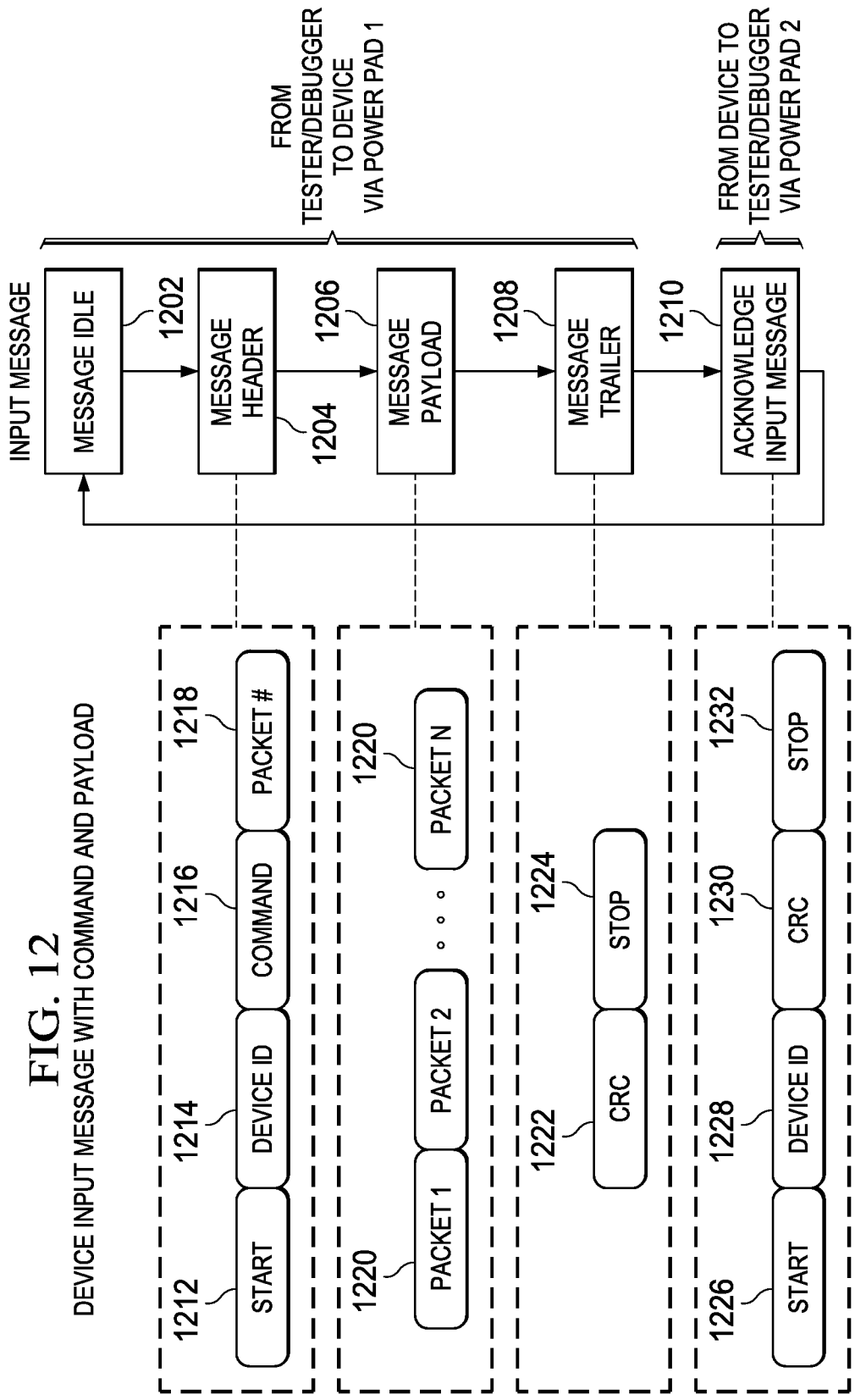
FIG. 12 illustrates a message format for transmitting test/debug command and payload information from a Tester/Debugger to a device according to the present disclosure.

FIG. 12 illustrates an example format of a Modulated Input Message from Tester/Debugger 1002 of FIG. 10 to Device 1004 of FIG. 10 via Power Pad 1 1010. This message format is for selecting a device, inputting a command to the selected device, followed by inputting a payload to the selected device. As seen, the message format consists of a Message Idle section 1202, a Message Header section 1204, a Message Payload section 1206, a Message Trailer section 1208, and an Acknowledge Message section 1210. The Message Header 1202, Message Payload 1204, and Message Trailer 1208 sections form the input portion of the message from the Tester/Debugger 1002 to the device 1004 via Power Pad 1 1010. The Message Acknowledge section 1210 forms the output portion of the message from the device 1004 to the Tester/Debugger 1002 via Power Pad 2 1012.

When no messages are being sent, the message will be in the Message Idle section 1202. A message starts by transitioning from the Message Idle section 1202 to the Message Header section 1204. During the Message Header section, the tester/debugger outputs a Start field 1212 to indicate the start of the message, a Device ID field 1214 to select a device, a Command field 1216 to load an instruction into the T/D Messaging & Control Circuitry 310 of the device, and a Packet # field 1218 to indicate the number of input packets to be sent during the Payload section 1204. From the Message Header section, the message transitions to the Message Payload section 1206 to input packet fields 1220. The packets are used to input test/debug command and/or data to the T/D Circuitry 322 via the Demodulation Circuitry 308 and T/D Messaging & Control Circuitry 310. From the Message Payload section, the message transitions to the Message Trailer section 1208 to input a cyclic redundancy code (CRC) field 1222 and a Stop field 1224. The CRC field is used to validate the correctness of the input message and the Stop field is used to end the input portion of the message. From the Message Trailer section, the message transitions to the Acknowledge Message section 1210 to transmit an acknowledgement back to the Tester/Debugger 1002, via Power Pad 2 1012, that device correctly received the input portion of the message. As seen the Acknowledge Message section consists of a Start field 1226 to start the acknowledge portion of the message, the Device ID field 1228 to identify the acknowledging device, a CRC field 1230 for checking the validity of the acknowledgement message, and a Stop Field to end the acknowledgement message. From the Acknowledge Message section 1210, the message of FIG. 12 transitions back to the Message Idle section 1202.

Figure 13:
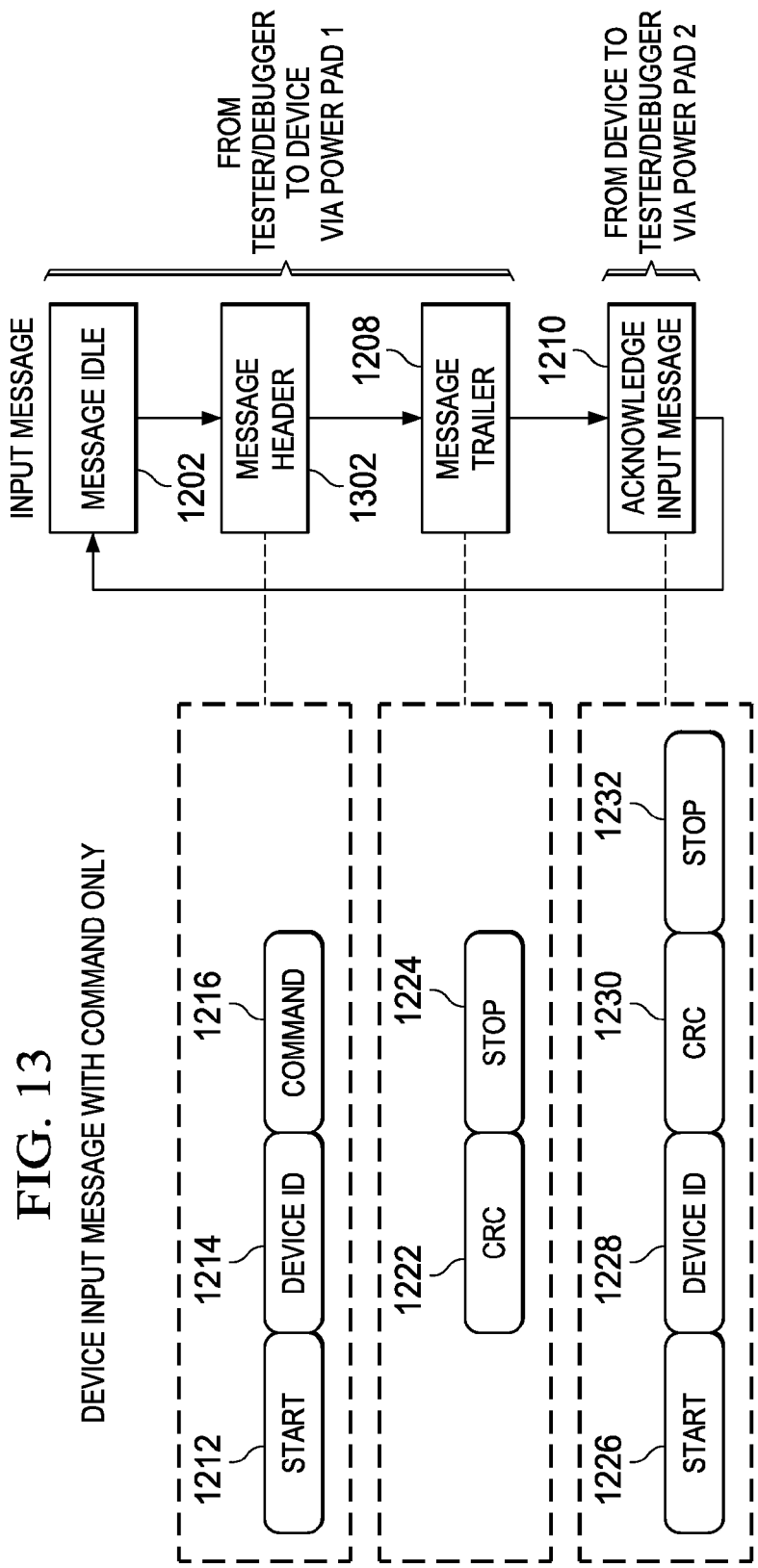
FIG. 13 illustrates a message format for transmitting test/debug command information from a Tester/Debugger to a device according to the present disclosure.

FIG. 13 illustrates an example format of a Modulated Input Message from Tester/Debugger 1002 of FIG. 10 to Device 1004 of FIG. 10 via Power Pad 1 1010. This message format is for selecting a device and inputting a command to the selected device. As seen, the message format consists of the Message Idle section 1202, a Message Header section 1302, the Message Trailer section 1208, and the Acknowledge Message section 1210. The Message Header 1302 and Message Trailer 1208 sections form the input portion of the message from the Tester/Debugger 1002 to the device 1004 via Power Pad 1 1010. The Message Acknowledge section 1210 forms the output portion of the message from the device 1004 to the Tester/Debugger 1002 via Power Pad 2 1012.

When no messages are being sent, the message will be in the Message Idle section 1202. A message starts by transitioning from the Message Idle section 1202 to the Message Header section 1302. During the Message Header section, the tester/debugger outputs a Start field 1212 to indicate the start of the message, a Device ID field 1214 to select a device, and a Command field 1216 to load an instruction into the T/D Messaging & Control Circuitry 310 of the device. From the Message Header section, the message transitions to the Message Trailer section 1208 to input the previously described CRC field 1222 and Stop field 1224. From the Message Trailer section, the message transitions to the Acknowledge Message section 1210 to transmit an acknowledgement back to the Tester/Debugger 1002, via Power Pad 2 1012, that device received the input portion of the message. The Acknowledge Message section 1210 contains the previously described Start 1226, Device ID 1228, CRC 1230, and Stop 1232 fields. From the Acknowledge Message section 1210, the message of FIG. 13 transitions back to the Message Idle section 1202.

Figure 14:
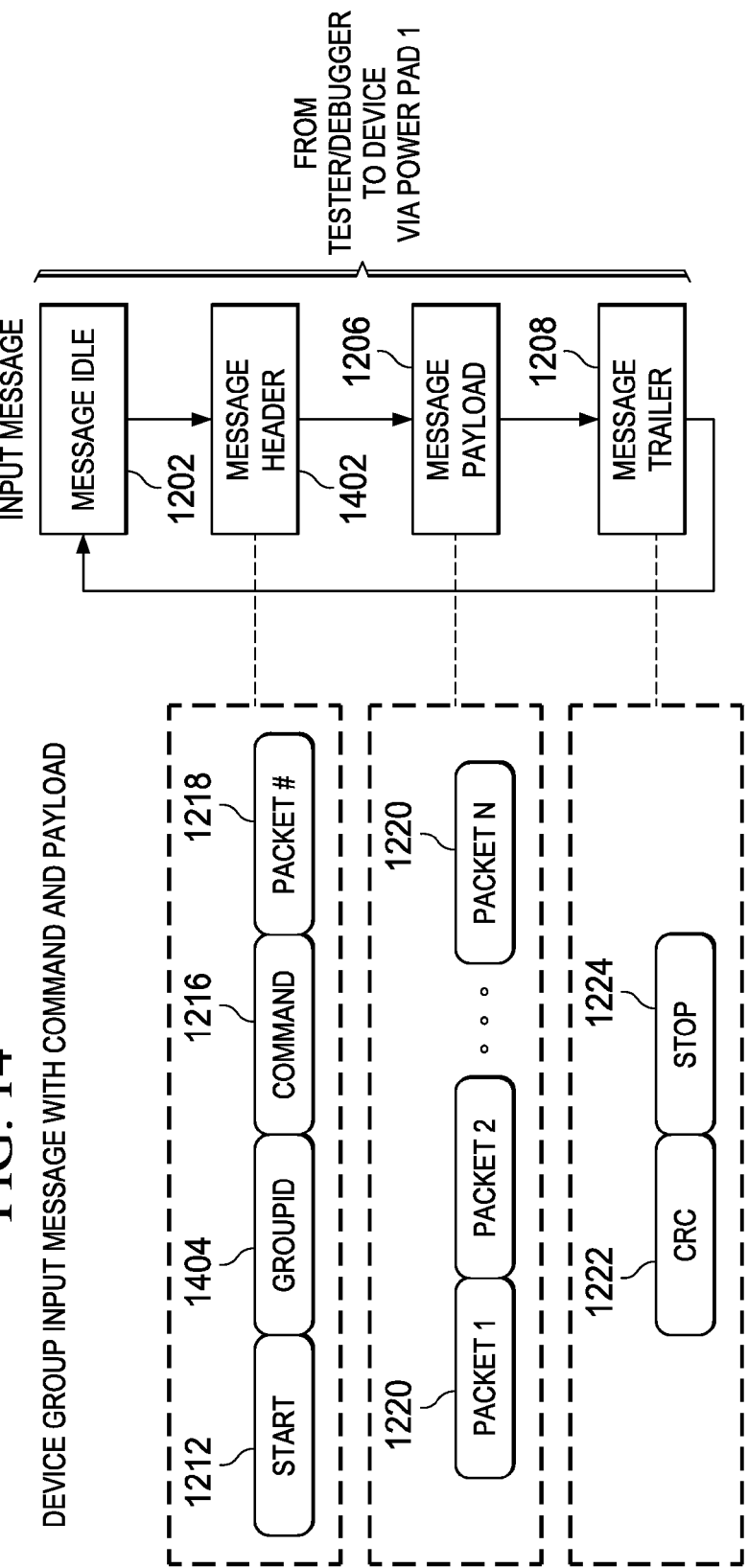
FIG. 14 illustrates a message format for transmitting test/debug command and payload information from a Tester/Debugger to a group of devices according to the present disclosure.

FIG. 14 illustrates an example format of a Modulated Input Message from Tester/Debugger 1002 of FIG. 10 to a group of Devices 1004 of FIG. 10 via Power Pad 1 1010. This message format is for selecting a group of devices, inputting a command to the selected group of devices, followed by inputting a payload to the selected group of devices. As seen, the message format consists of a Message Idle section 1202, a Message Header section 1402, a Message Payload section 1206, and a Message Trailer section 1208. Since this message is being input to a group of devices, the previously described acknowledge message section is not utilized, since multiple devices would have to send acknowledges back to the Tester/Debugger. However, acknowledgement could be done if desired by having each Device output an acknowledge message back to the Tester/Debugger using a messaging arbitration scheme.

When no messages are being sent, the message will be in the Message Idle section 1202. A message starts by transitioning from the Message Idle section 1202 to the Message Header section 1402. During the Message Header section, the tester/debugger outputs a Start field 1212 to indicate the start of the message, a Group ID field 1214 to select a group of devices, a Command field 1216 to load an instruction into the T/D Messaging & Control Circuitry 310 of the selected group of devices, and a Packet # field 1218 to indicate the number of input packets to be sent during the Payload section 1204. From the Message Header section, the message transitions to the Message Payload section 1206 to input packet fields 1220. The packets are used to input test/debug command and/or data information to the T/D Circuitry 322 via the Demodulation Circuitry 308 and T/D Messaging & Control Circuitry 310. From the Message Payload section, the message transitions to the Message Trailer section 1208 to input the previously mentioned CRC 1222 and Stop 1224 fields. From the Message Trailer section, the message of FIG. 14 transitions back to the Message Idle section 1202.

The devices selected by the Group ID will have been previously identified by inputting a Command field into the devices to be group selected, using either of the device input message formats of FIGS. 12 and 13. The Command input will enable the selected devices to respond to the Group ID to be part of the group of devices selected by this message format. Devices that have not received this Command input will not be enabled to be selected by the Group ID input of this message.

Figure 15:
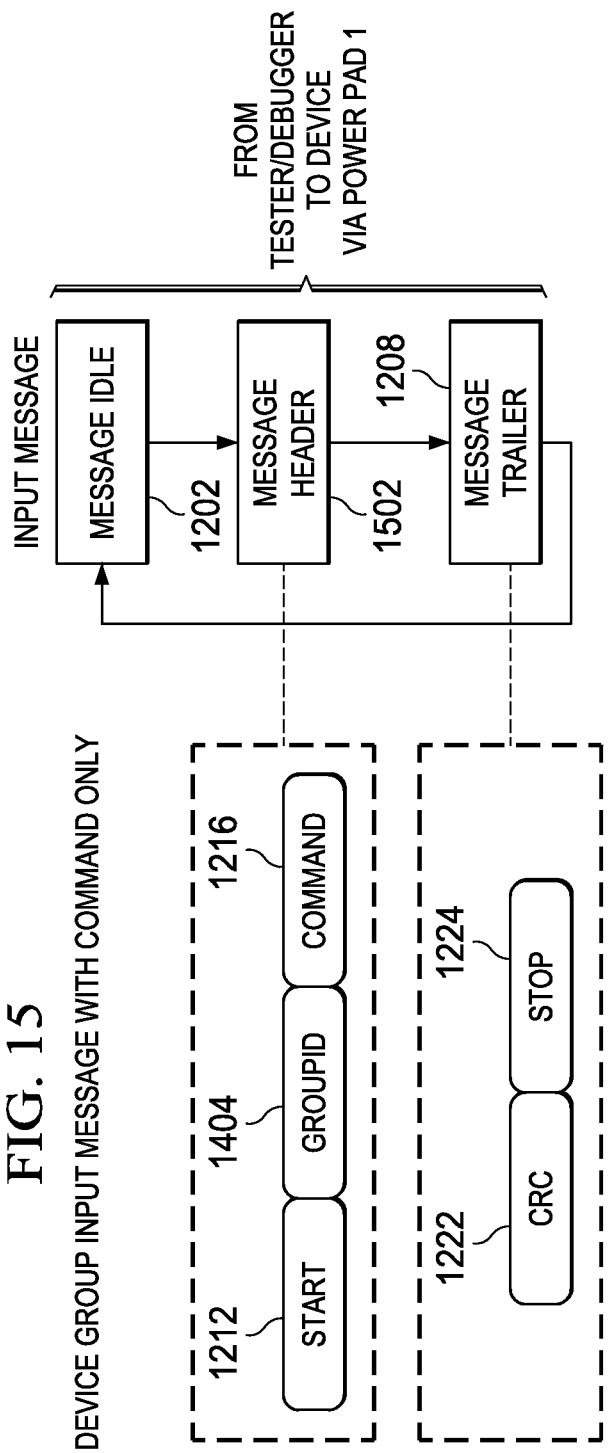
FIG. 15 illustrates a message format for transmitting test/debug command information from a Tester/Debugger to a group of devices according to the present disclosure.

FIG. 15 illustrates an example format of a Modulated Input Message from Tester/Debugger 1002 of FIG. 10 to a group of Devices 1004 of FIG. 10 via Power Pad 1 1010. This message format is for selecting a group of devices and inputting a command to the selected group of devices. As seen, the message format consists of a Message Idle section 1202, a Message Header section 1502, and a Message Trailer section 1208. For the reasons mentioned in regard to the message of FIG. 14, this message format does not include an acknowledge message section.

When no messages are being sent, the message will be in the Message Idle section 1202. A message starts by transitioning from the Message Idle section 1202 to the Message Header section 1502. During the Message Header section, the tester/debugger inputs a Start field 1212 to indicate the start of the message, a Group ID field 1214 to select a group of devices, and a Command field 1216 to load an instruction into the T/D Messaging & Control Circuitry 310 of the selected group of devices. From the Message Header section, the message transitions to the Message Trailer section 1208 to input the previously mentioned CRC 1222 and Stop 1224 fields. From the Message Trailer section, the message of FIG. 15 transitions back to the Message Idle section 1202.

As mentioned in regard to FIG. 14, the devices selected by the Group ID will have been previously identified by inputting a Command field into the devices to be group selected, using either of the device input message formats of FIGS. 12 and 13.

Figure 16:
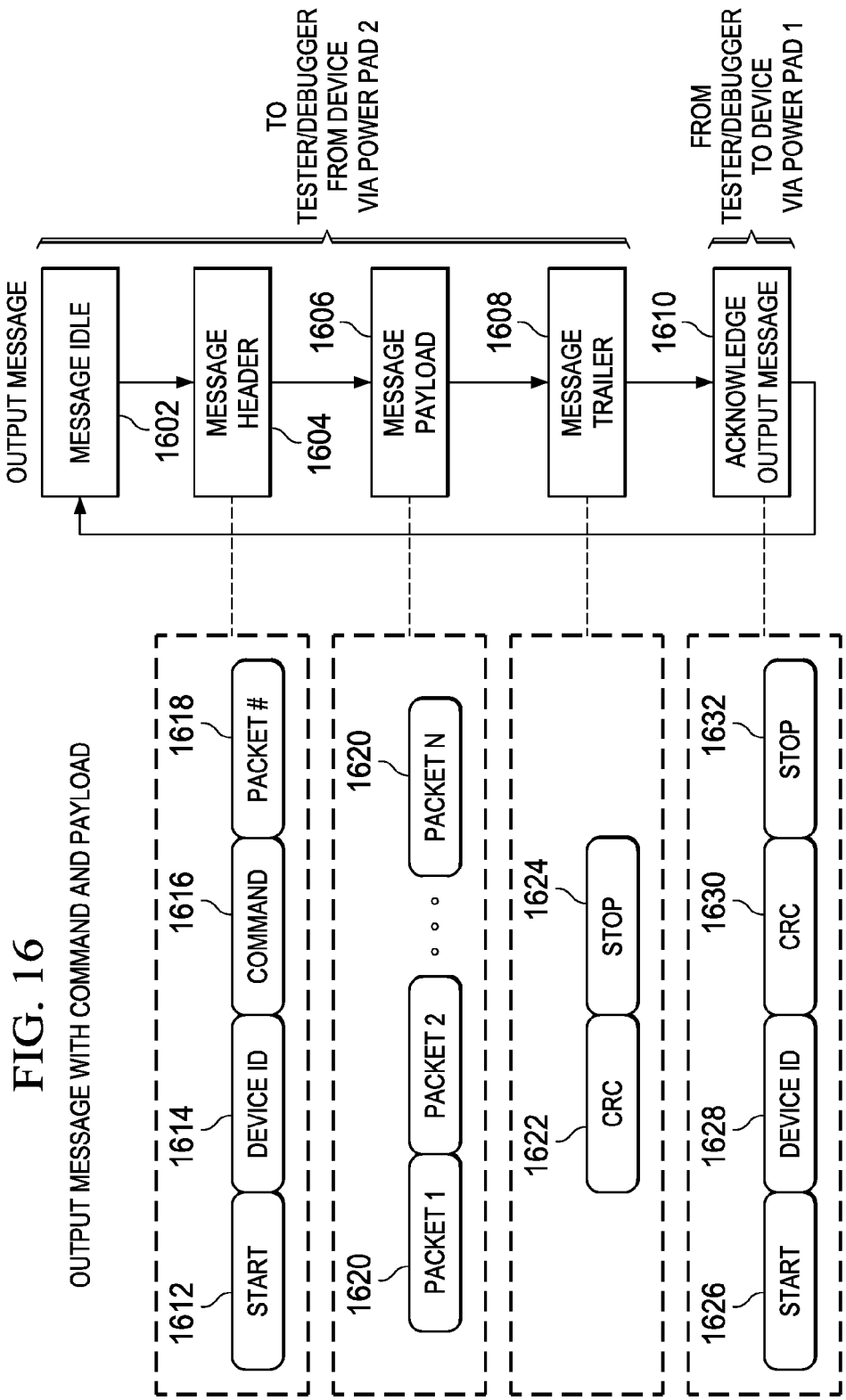
FIG. 16 illustrates a message format for transmitting test/debug output information from a device to a Tester/Debugger according to the present disclosure.

FIG. 16 illustrates an example format of a Modulated Output Message from Device 1004 to Tester/Debugger 1002 of FIG. 10 via Power Pad 2 1012. This message format is for outputting a command from the device to the Tester/Debugger, followed by outputting a payload from the device to the Tester/Debugger. As seen, the message format consists of a Message Idle section 1602, a Message Header section 1604, a Message Payload section 1606, a Message Trailer section 1608, and an Acknowledge Message section 1610. The Message Header 1604, Message Payload 1606, and Message Trailer 1608 sections form the output portion of the message from the device 1004 to Tester/Debugger 1002 via Power Pad 2 1012. The Message Acknowledge section 1610 forms the input portion of the message from the Tester/Debugger 1002 to device 1004 via Power Pad 1 1010.

When no messages are being sent, the message will be in the Message Idle section 1602. A message starts by transitioning from the Message Idle section 1602 to the Message Header section 1604. During the Message Header section, the device outputs a Start field 1612 to indicate the start of the message, a Device ID field 1614 to identify the device, a Command field 1616 to load an instruction into the T/D Controller & Messaging Circuitry 608 of Tester/Debugger 1002, and a Packet # field 1618 to indicate the number of output packets to be sent during the Payload section 1606.

From the Message Header section, the message transitions to the Message Payload section 1606 to output packet fields 1620. The packets are used to input test/debug information from the T/D Circuitry 322 of the device 1004 to the T/D Controller & Messaging Circuitry 608 of the Tester 1002 via the device's Modulation Circuitry 408 and T/D Messaging & Control Circuitry 310. From the Message Payload section, the message transitions to the Message Trailer section 1608 to input a CRC field 1622 and a Stop field 1624. The CRC field is used to validate the correctness of the output message and the Stop field is used to end the output portion of the message. From the Message Trailer section, the message transitions to the Acknowledge Output Message section 1610 to receive an acknowledgement from the Tester/Debugger 1002, via Power Pad 1 1010, that the Tester/Debugger correctly received the output portion of the message. As seen the Acknowledge Message section consists of a Start field 1626 to start the acknowledge portion of the message, the Device ID field 1628 to identify the device to which the acknowledgement is directed, a CRC field 1630 for checking the validity of the acknowledgement message, and a Stop Field to end the acknowledgement message. From the Acknowledge Message section 1610, the message of FIG. 16 transitions back to the Message Idle section 1602.

Figure 17:
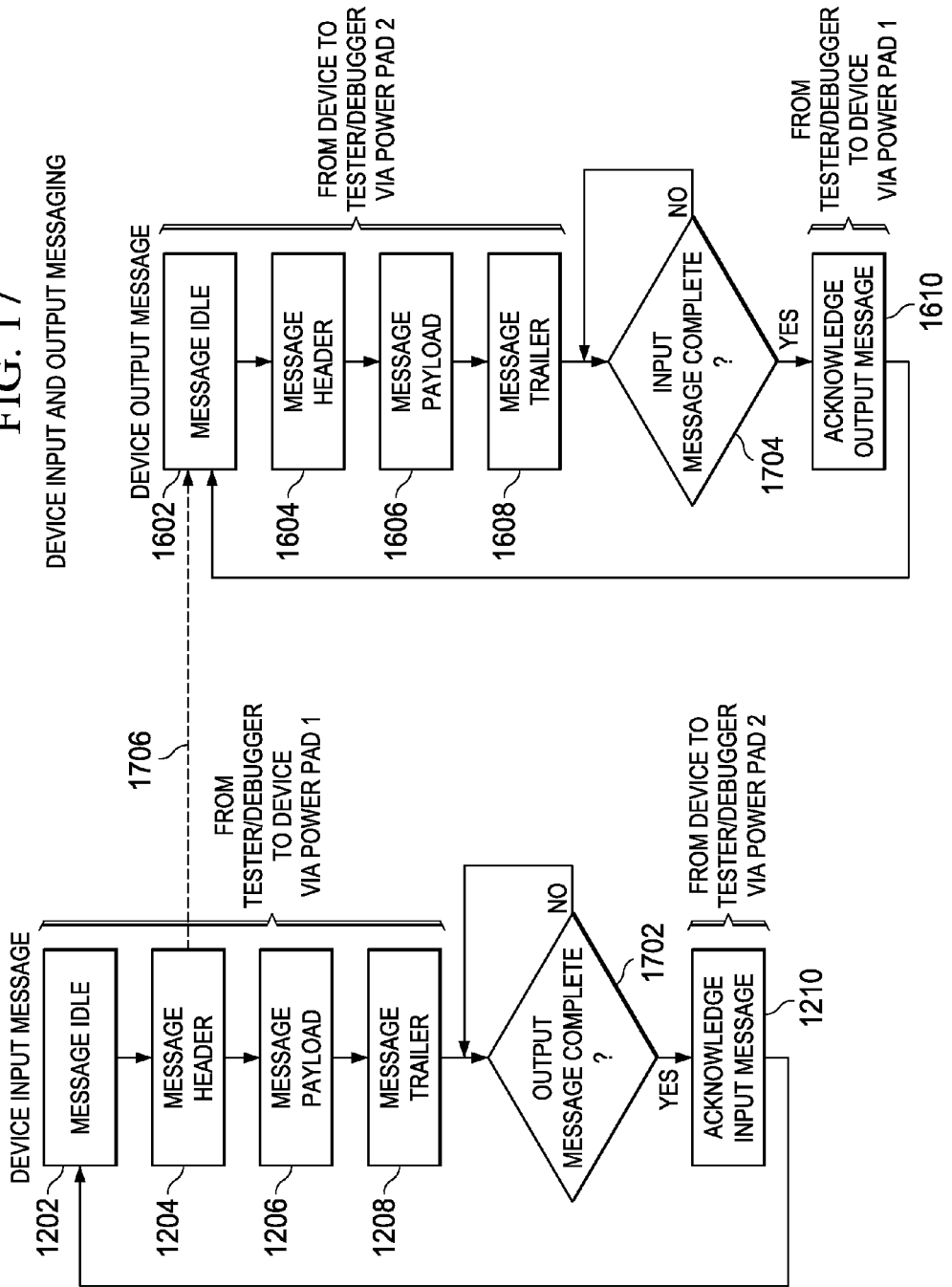
FIG. 17 illustrates a simultaneous input and output messaging format between a Tester/Debugger and device according to the present disclosure.

FIG. 17 illustrates an example format of a Modulated Input and Output Message occurring between Tester/Debugger 1002 and Device 1004 of FIG. 10 via Power Pads 1 and 2 1010-1012. This message format is for selecting a device, inputting a command to the selected device, followed by inputting a payload to the selected device from the Tester/Debugger and outputting a payload from the selected device to the Tester/Debugger. The Device input message format is similar the input message format described in FIG. 12 with the exception that the message format includes an Output Message Complete decision section 1702. The Device output message format is similar to the output message format described in FIG. 16 with the exception that the message format includes an Input Message Complete decision section 1704.

The input and output messaging starts by the Tester/Debugger 1002 outputting a Message Header 1204 to device 1004 via Power Pad 1 1010. In response to the Command field 1216 within the Message Header 1204, as indicated by dotted line 1706, the device 1004 starts its output message to Tester/Debugger 1002 on Power Pad 2 1012 by transitioning to the Message Header section 1604.

The input messaging from the Tester/Debugger 1002 to device 1004 operates as previously described in FIG. 12 up until the message transitions to the Output Message Complete decision section 1702, where it waits for the output message being transmitted on Power Pad 2 1012 to complete. Waiting is required since the input acknowledge message that occurs in Acknowledge Input Message section 1210 uses Power Pad 2 1012 which is also being used to send the output message from the device 1004 to the Tester/Debugger 1002. Once the output message is complete, the input message transitions to the Acknowledge Input Message section 1210 to transmit the input message acknowledge to Tester/Debugger 1002 via Power Pad 2 1012, then transitions to the Message Idle section 1202.

The output messaging from the device 1004 to Tester/Debugger 1002 operates as previously described in FIG. 16 up until the message transitions to the Input Message Complete decision section 1704, where it waits for the input message being transmitted on Power Pad 1 1010 to complete. Waiting is required since the output acknowledge message that occurs in Acknowledge Output Message section 1610 uses Power Pad 1 1010 which is also being used to send the input message from the Tester/Debugger 1002 to device 1004. Once the input message is complete, the output message transitions to the Acknowledge Output Message section 1610 to receive the output message acknowledge from Tester/Debugger 1002 via Power Pad 1 1010, then transitions to the Message Idle section 1602.

The Tester/Debugger 1002 is designed to execute the input and output messages, via Power Pads 1010 and 1012, as shown in FIG. 17. For example, the Tester/Debugger 1002 knows to wait until the output message from the device 1004 is complete before receiving the input acknowledge message, via Power Pad 2 1012, from the device 1004 during Acknowledge Input Message section 1210 of the input message. The Tester/Debugger 1002 also knows to wait until the input message to the device 1004 is complete before transmitting the output acknowledge message, via Power Pad 1 1010, to the device 1004 during Acknowledge Output Message section 1610 of the output message.

The input and output messaging scheme shown in FIG. 17 is advantageous in that it allows test/debug information to flow simultaneously between Tester/Debugger 1002 and device 1004 using isolated Power Pads 1010 and 1012 as mentioned in regard to FIG. 11.

While the example message formats of FIGS. 12-17 have illustrated of how test/debug messages can be transmitted between a device and tester/debugger, the disclosure is not limited to use of these specific message formats. Indeed, any existing or new message format can be used to achieve the test/debug messaging of the present disclosure.

Figure 18:
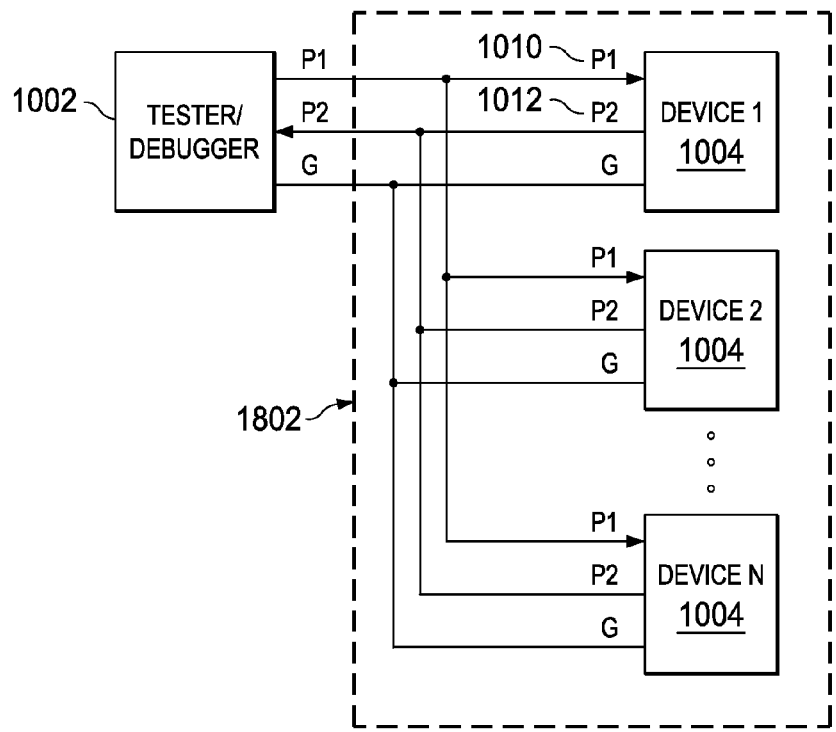
FIG. 18 illustrates a Tester/Debugger connected to plural devices via power and ground pads according to the present disclosure.

FIG. 18 illustrates a electrical system 1802 comprised of plural devices 1004, each coupled to the Tester/Debugger 1002 of FIG. 10 via isolated Power Pads 1 (P1) 1010 and 2 (P2) 1012. Each device may have a separate system function, but each includes the general test architecture of device 1004 of FIG. 10. The system 1802 could be a cell phone, a camera, a PDA, a computer, or any type of electrical system having one or more devices that need to be tested/debugged using device power and ground terminals as described in the present disclosure. The Tester/Debugger 1002 can access each device separately for test/debug input operations using messaging as described in FIGS. 12 and 13. The Tester/Debugger 1002 can access each device separately for test/debug output operations using messaging as described in FIG. 16. The Tester/Debugger 1002 can access each device separately for test/debug input and output operations using messaging as described in FIG. 17. The Tester/Debugger 1002 can access a selected group of devices for test/debug input operations using messaging as described in FIGS. 14 and 15.

Figure 19:
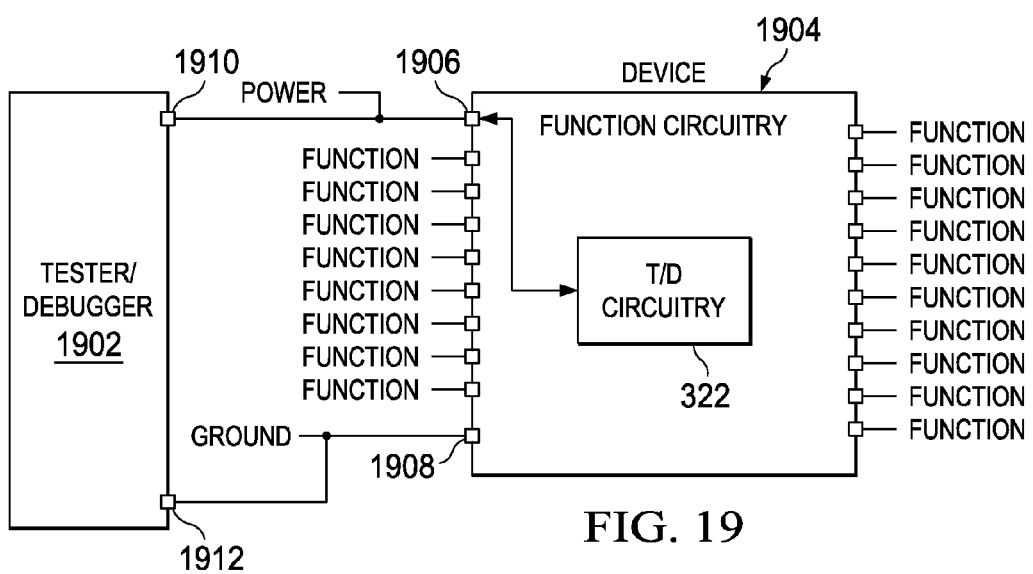
FIG. 19 illustrates a second test/debug interface arrangement between a Tester/Debugger and a Device according to the present disclosure.

FIG. 19 illustrates a high level view of an alternate embodiment of the present disclosure. The alternate embodiment uses only a single device power 1906 and ground 1908 terminal for providing test/debug communication between a tester/debugger 1902 and a device 1904, each terminal being adapted for such communication. The test/debug communication is achieved by modulating test/debug messages over the single DC power terminal of the device. By modulating test/debug messages over the DC power terminal, T/D circuitry 322 within the device can be accessed and controlled to execute the device test/debug operations previously described, with the exception of the simultaneous input and output test/debug messaging of FIG. 17. This embodiment of the present disclosure is particularly useful when the device being tested or debugged only has a single power terminal 1906.

FIG. 20 illustrates a more detail view of device 1904. Power pad 1906 provides a voltage, via the previously described filter 312, to Common Voltage Domain Circuits 2002 and 2004. Ground pad 1908 provides a ground for Common Voltage Domain Circuits 2002 and 2004. The voltage domains 2002 and 2004 may contain any mix of digital, mixed signal, or analog circuits.

Circuit 2006 of device 1904 includes the Modulation Circuitry 408, the Demodulation Circuitry 310, and the T/D Messaging & Control Circuitry 310 of FIG. 10. Power pad 1906 is coupled to the input 2008 of the Demodulation Circuitry 308 and to the output 2010 of Modulation Circuitry 408, via capacitor 2012. Modulated input messages from Tester/Debugger 1902 may be input, via power pad 1906, to Circuit 2006 of the device 1904, and modulated output messages to Tester/Debugger 1902 may be output, via power pad 1906, from Circuit 2006 of the device 1904. The ground pad 1908 is connected to a ground lead of Tester/Debugger 1902.

Circuit 2006 can receive a modulated Input Message from the Tester/Debugger via power pad 1906 and extract and forward the T/D Input portion of the message to a selected T/D Circuit 322 in either voltage domain 2002 or 2004. Circuit 2006 can also receive a T/D Output from the selected T/D Circuit 322 and transmit a modulated Output Message, including the T/D Output, to the Tester/Debugger via power pad 1906. Since device 1904 has only one power pad 1906, only a Modulated T/D Input Message or a Modulated T/D Output message can be performed at any one time.

Figure 21:
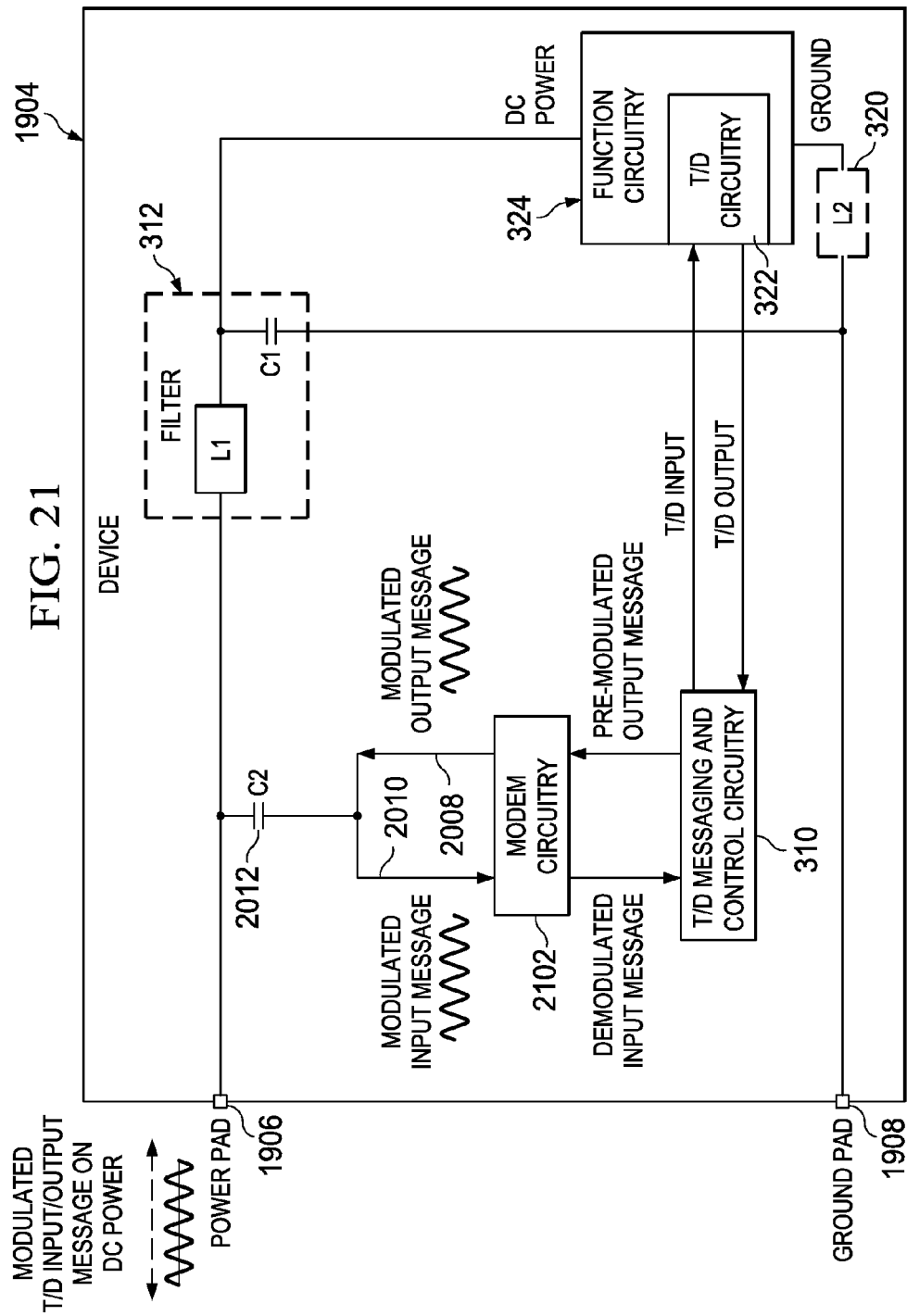
FIG. 21 illustrates circuitry in a device for transmitting and receiving a modulated test/debug message on a single power pad according to the present disclosure.

FIG. 21 illustrates an example implementation of circuitry within device 1904 for receiving a modulated test/debug input message from a power pad 1906 and transmitting a modulated test/debug output message to power pad 1906. The circuitry consists of Modem Circuitry 2102 which includes Demodulation Circuitry 308 and Modulation Circuitry 408, T/D Messaging & Control Circuitry 310, filter 312, capacitor 2012, and optionally inductor 320.

During input messaging from the Tester/Debugger, the Demodulation circuitry 308 of Circuit 2102 receives the modulated T/D input message from the power pad 1906 via capacitor 2012. Capacitor 2012, like capacitor 318, blocks DC voltage from the power pad but allows the modulated message to pass from the power pad to the Demodulation circuitry. The Demodulation Circuitry demodulates the message and outputs the demodulated message to the T/D Messaging & Control Circuitry 310.

The T/D Messaging & Control Circuitry 310 interprets the message and converts it into a T/D Input format for input to the device's T/D Circuitry 322. As mentioned in regard to FIG. 3, the format of the T/D Input may be of any type currently known in the industry, or any future type of T/D Input format.

The T/D Circuitry 322 receives the T/D Input from the T/D Messaging & Control Circuitry 310 and uses the input to setup and execute any of the function circuit test or debug operations described in regard to FIGS. 1A and 1F, as well as any other test or debug operations.

During output messaging to the Tester/Debugger, the Modulation circuitry 408 of Circuit 2102 receives a pre-modulated test/debug output message from T/D Messaging & Control Circuitry 310 and outputs a Modulated Output Message to power pad 1906 via capacitor 2012. Capacitor 2012 blocks DC voltage from the power pad but allows the modulated message to pass from the Modulation Circuitry 408 to the power pad 1906.

The T/D Messaging & Control Circuitry 310 receives the T/D Output format from the T/D Circuit 322 and converts it into the pre-modulated output message sent to the Modulation Circuitry 408. The format of the T/D Output from the T/D Circuitry 322 may be of any type currently known in the industry, or any future type of T/D Output format.

The T/D Circuitry 322 outputs the T/D Output to the T/D Messaging & Control Circuitry 310 as a result of executing any of the function circuit test and debug operations described in regard to FIGS. 1A and 1F, as well as any other T/D operations.

Figure 22:
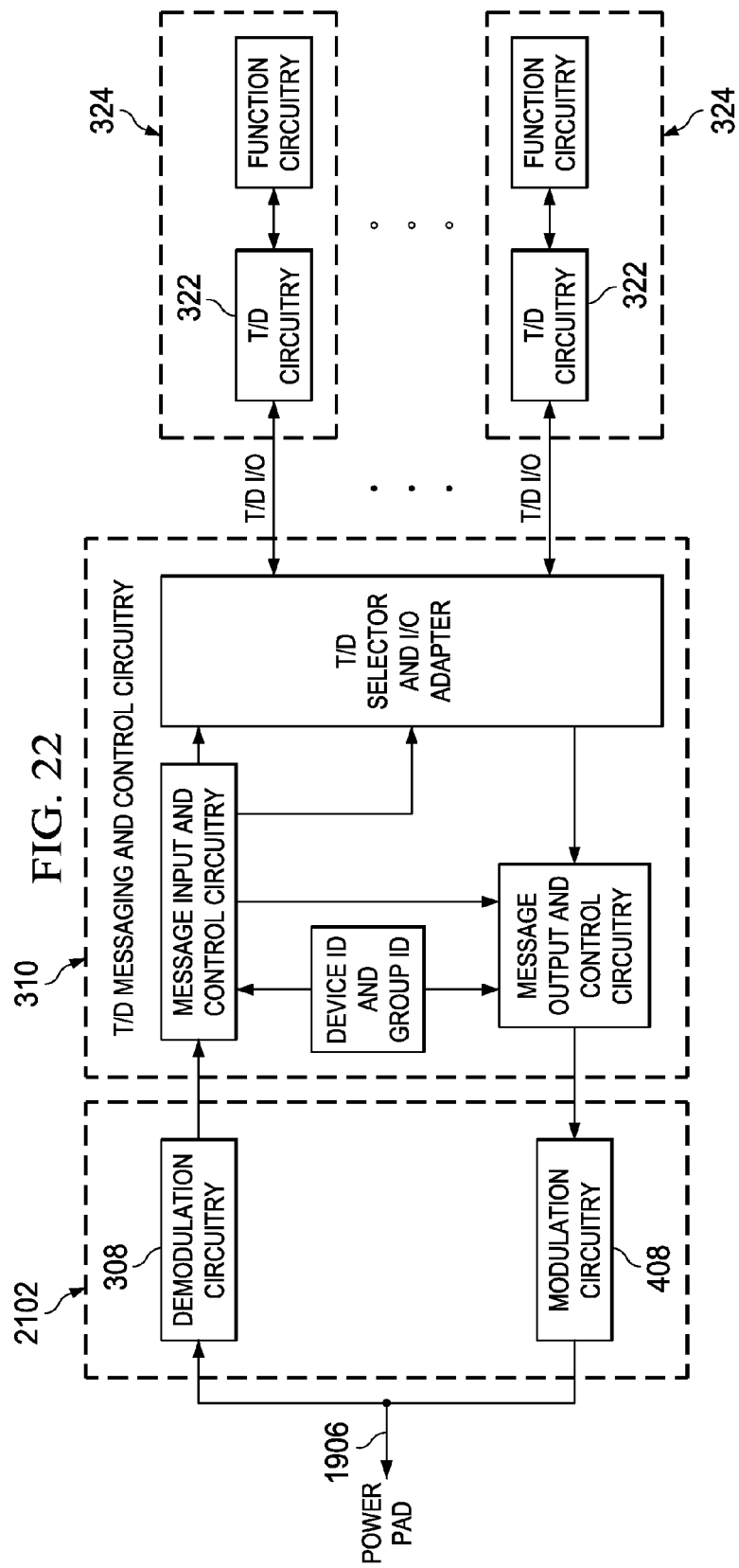
FIG. 22 illustrates Test/Debug Messaging & Control Circuitry for communicating to Test/Debug Circuits in a device using a single power pad according to the present disclosure.

FIG. 22 illustrates one example implementation of the Modem Circuitry 2102, which consists of Modulation 308 and Demodulation 408 circuits, and the T/D Messaging & Control Circuitry 310. The operation of these circuits 308, 408, and 310 is the same as previously described in regard to FIG. 5, with the exception that since the Modulation 408 and Demodulation 308 Circuits are both connected to the same power pad, only one of the circuits 308 or 408 can be active at a time to input or output a modulated test/debug message.

Figure 23:
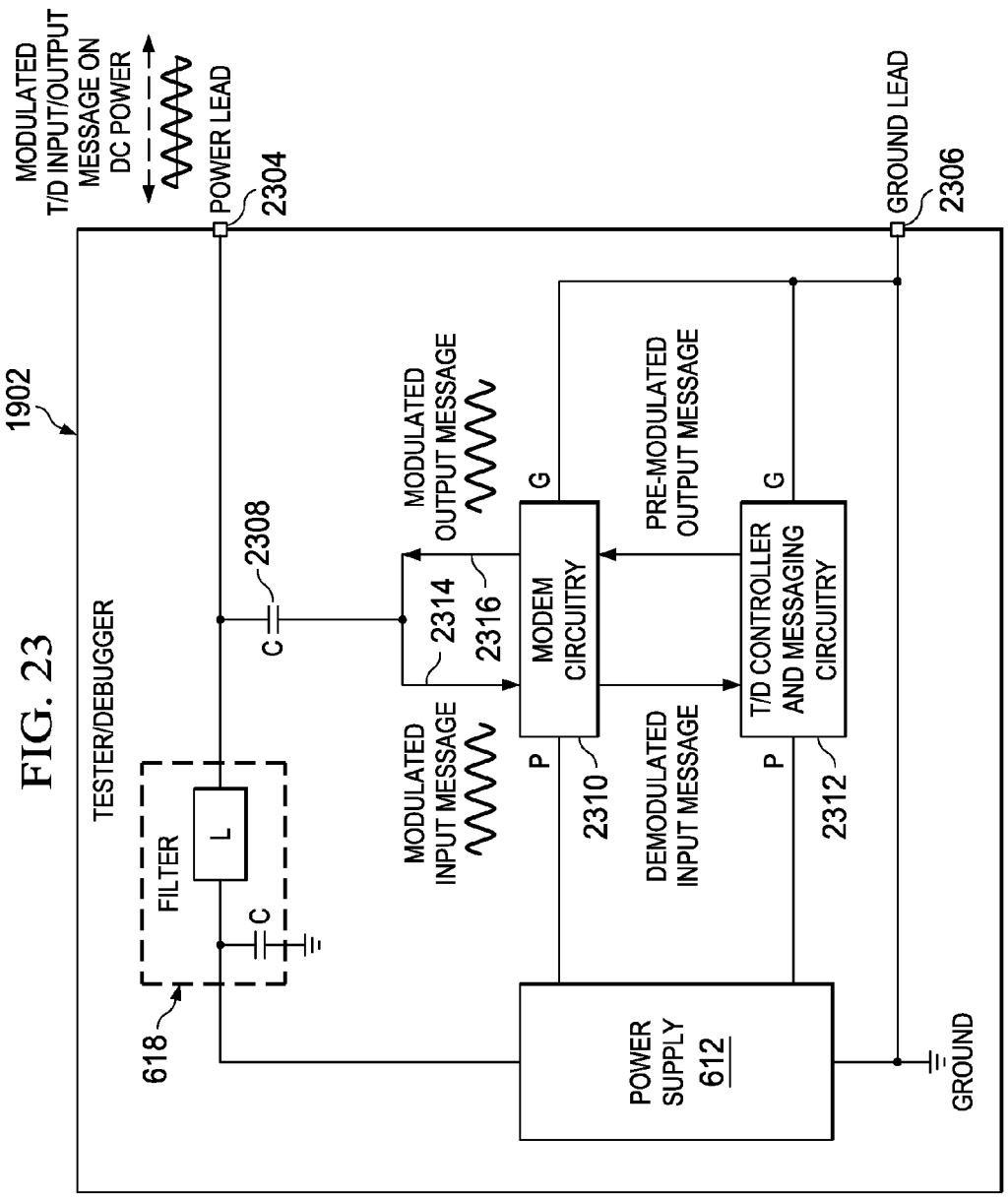
FIG. 23 illustrates circuitry in a Tester/Debugger for inputting and outputting a modulated test/debug message on a lead according to the present disclosure.

FIG. 23 illustrates a first example implementation of Tester/Debugger 1902 of FIG. 19. The Tester/Debugger consists of a power supply 612, a Modem Circuit 2310, a T/D Controller & Messaging Circuit 2312, a Capacitor 2308, a power lead 2304, and a ground lead 2306. The power and ground leads are coupled to the power pad and ground pad of a device(s) being tested. The Modem Circuit 2310 comprises Modulation Circuit 606 of FIG. 6 and Demodulation Circuit 706 of FIG. 7. The T/D Controller & Messaging Circuit 2312 is the same as the one shown in FIGS. 6 and 7. The power supply 612 powers circuits 2310 and 2312 and the device(s) being tested. Filter 618 serves to isolate the message modulations from power supply 612. Modulated Input Messages are received at power lead 2304 from a power pad of a device, pass through capacitor 2308 to Demodulation Circuit 706 of Modem Circuit 2310 where they are demodulated and output to T/D Controller & Messaging Circuit 2312. Pre-Modulated Output Messages are output from the T/D Controller & Messaging Circuit 2312 to the Modulation Circuit 606 of Circuit 2310 where they are modulated and output to power lead 2304 via capacitor 2308. Since the Tester/Debugger 1902 has only one power lead 2304 the input of Modulated Input Messages from power lead 2304 and the output of Modulated Output Messages to power lead 2304 must occur at separate times.

Figure 24:
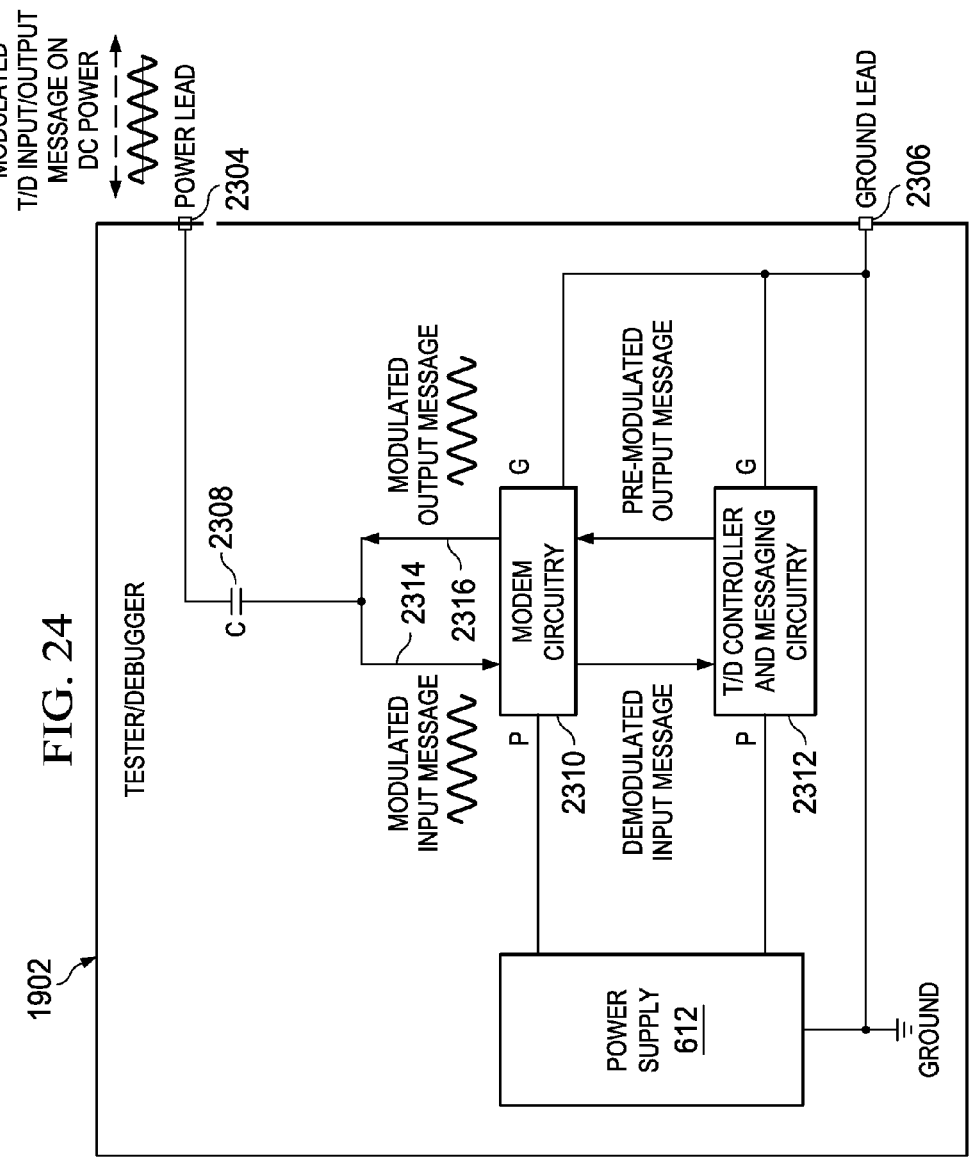
FIG. 24 illustrates alternate circuitry in a Tester/Debugger for inputting and outputting a modulated test/debug message on a lead according to the present disclosure.

FIG. 24 illustrates a second example implementation of Tester/Debugger 1902. The Tester/Debugger is the same as the one shown in FIG. 23 with the exceptions that the Tester/Debugger does not include Filter 618 and does not supply power to the device(s) for the reasons mentioned in regard to FIGS. 8 and 9.

Figure 25:
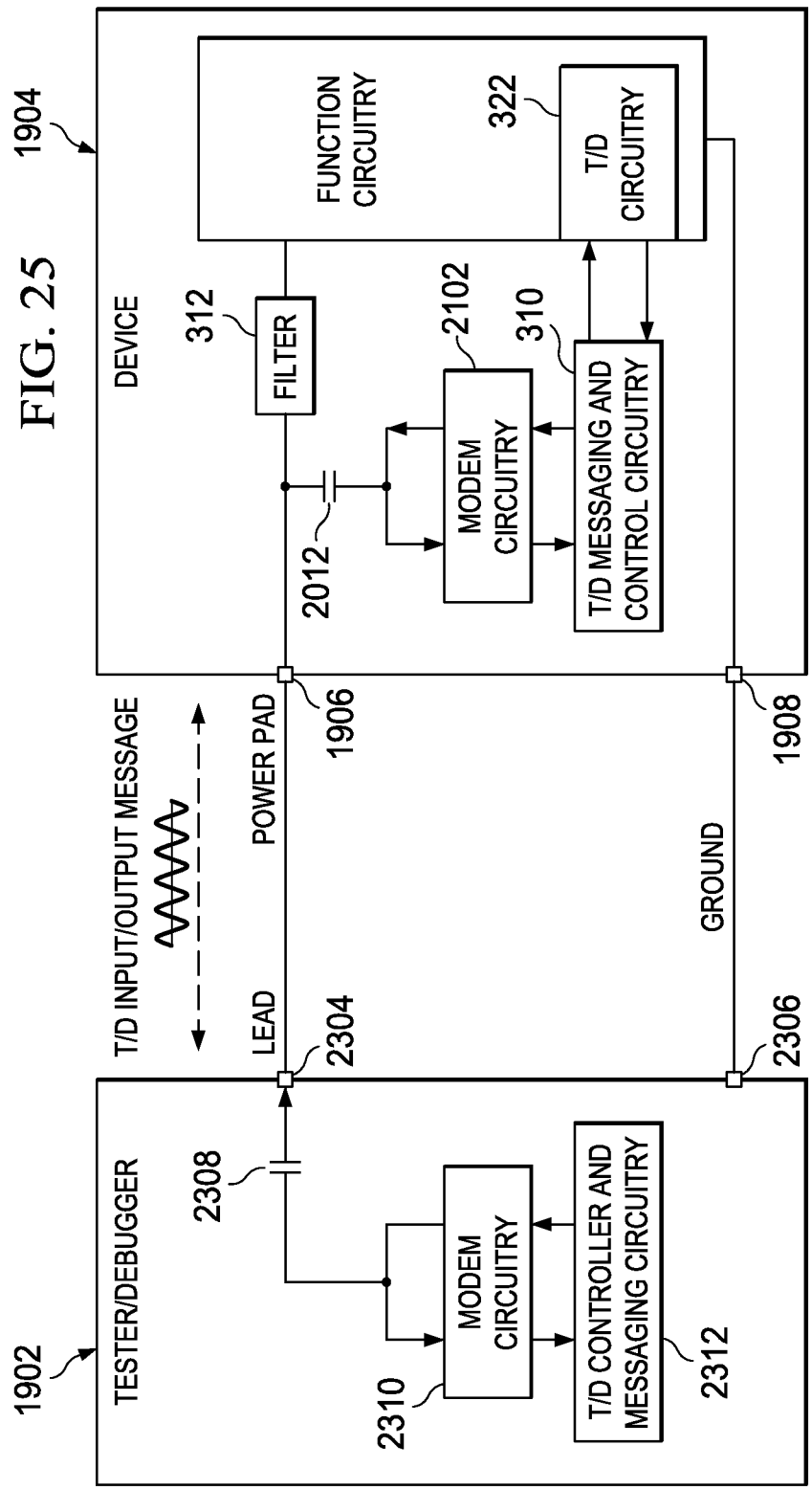
FIG. 25 illustrates the connection between a Tester/Debugger and device for communicating modulated test/debug messages according to the present disclosure.

FIG. 25 illustrates a test arrangement where a Tester/Debugger 1902 is connected to a device 1904 to be tested or debugged. The Modem Circuitry 2310 of the Tester/Debugger is coupled to the device power pad 1906 via capacitor 2308 and connection between Tester/Debugger lead 2304 and device power pad 1906. The ground lead 2306 of the Tester/Debugger is coupled to the device ground pad 1908. The test/debug operation is executed by the Tester/Debugger sending and receiving modulated messages over the connections formed between the Tester/Debugger and device power pad. As can be seen, the test/debug operation does not require any functional pads of the device, just contact to the device's power and ground pads. The Tester/Debugger 1902 may be the tester/debugger of FIG. 23 or 24.

FIG. 26 illustrates a electrical system 2602 comprised of plural devices 1904, each coupled to the Tester/Debugger 1902 of FIG. 25 via power pads (P) 1906 and ground pads (G) 1908. Each device may have a separate system function, but each includes the general test/debug architecture of device 1904 of FIG. 25. The system 2602 could be a cell phone, a camera, a PDA, a computer, or any type of electrical system having one or more devices that need to be tested or debugged using device power and ground terminals as described in the present disclosure. The Tester/Debugger 1902 can access each device separately for test/debug input operations using messaging as described in FIGS. 12 and 13. The Tester/Debugger 1902 can access each device separately for test/debug output operations using messaging as described in FIG. 16. The Tester/Debugger 1902 can access a selected group of devices for test/debug input operations using messaging as described in FIGS. 14 and 15.

Figure 27:
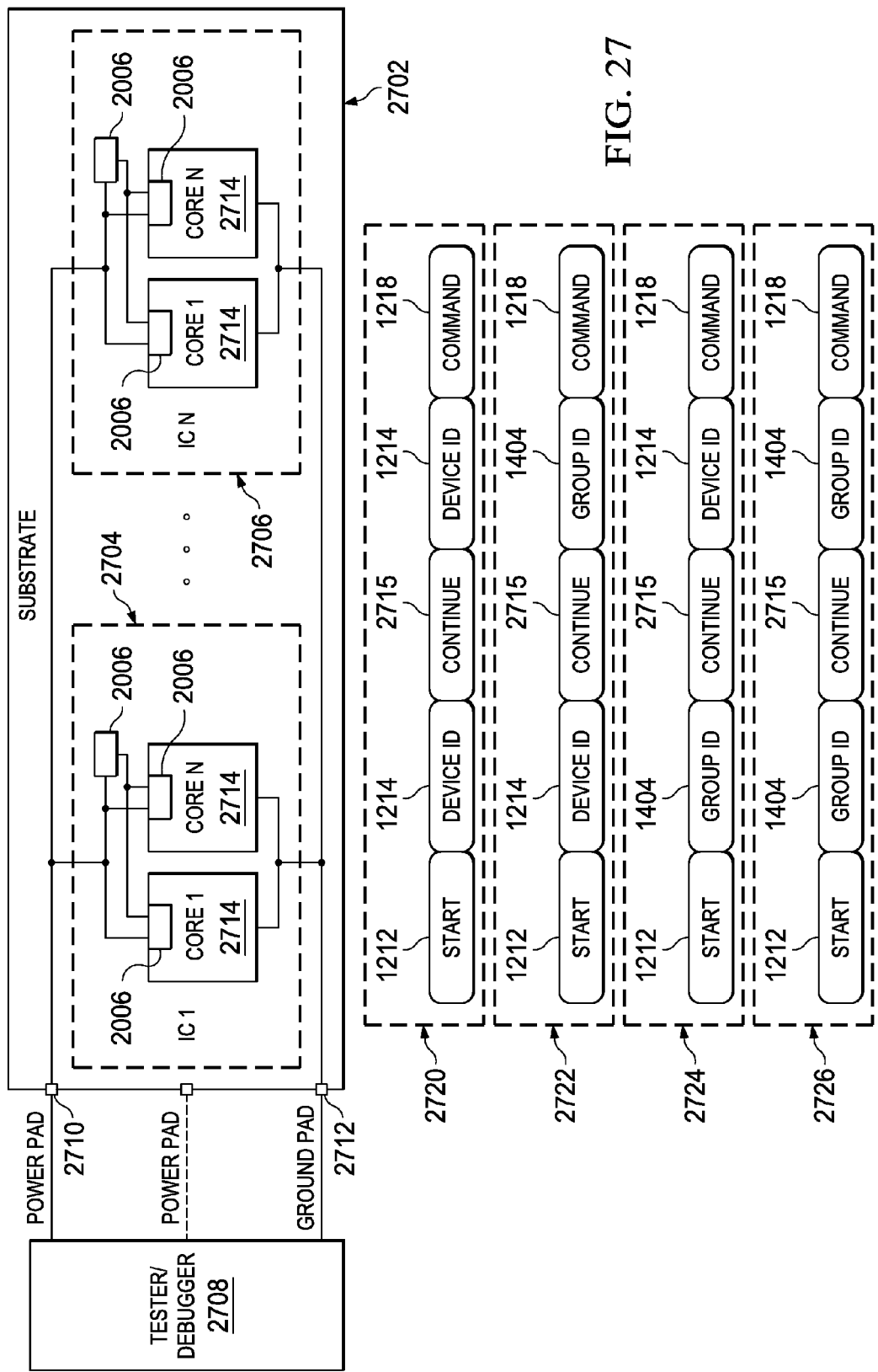
FIG. 27 illustrates a Tester/Debugger connected to a device having hierarchically accessible test/debug messaging circuits according to the present disclosure.

FIG. 27 illustrates an electrical system 2702 comprised of plural devices 2704-2706 of varying functionality, each device being coupled to a Tester/Debugger 2708 via device power and ground pads 2710 and 2712. Each device contains plural core circuits 2714 of varying functionality. Each device 2704-2706 and its core circuits 2714 contain the test/debug messaging circuit 2006 of FIG. 20, which comprises Modem circuit 2102 and T/D Messaging & Control Circuitry 310 as described in FIG. 21. While not shown, each device also comprises a filter 312 for the purposes previously described. The system 2702 could be a cell phone, a camera, a PDA, a computer, or any type of electrical system having one or more devices that need to be tested or debugged using device power and ground terminals as described in the present disclosure.

The device's test/debug messaging circuit 2006 is coupled to T/D Circuitry 322 that exists in the device and is separate from the core circuits 2714. The core's test/debug messaging circuits 2006 are coupled to T/D Circuitry 322 within the cores. If access to a device's test/debug messaging circuit 2006 is required, the Tester/Debugger can use one of the previously described Message Headers 1204, 1302, 1402, 1502, and 1604 of FIGS. 12-16. However, if access to a device's core test/debug messaging circuit 2006 is required, a Hierarchical Message Header must be defined and used.

As the name implies, a Hierarchical Message Header allows accessing any test/debug messaging circuit 2006 that exists within a hierarchy of test/debug messaging circuits 2006 within a device or system. The following are descriptions of Hierarchical Message Headers that can be used to hierarchically access cores 2714 within devices 2704-2706 of the system 2702 of FIG. 27. According to the present disclosure, these Hierarchical Message Headers can be substituted for the previously described Message Headers of FIG. 12-16 to enable access of test/debug messaging circuits 2006 that are arranged in a hierarchy, such as in system 2702.

Hierarchical Message Header 2720 comprises a Start field 1212, a first Device ID field 1214, a Continuation Field 2715, a second Device ID field 1214, and a Command field 1218. The first Device ID field is used to select a first device (i.e. one of the devices 2704 of system 2702). The Continuation field 2715 indicates that one or more second devices within the first device needs to be selected. The second Device ID field is used to select a second device (i.e. one of the cores 2714 within of the first device 2704). The Command field 1218 is used to load an instruction into the second device's test/debug messaging circuit 2006. This Hierarchical Message Header allows hierarchically selecting a device within a device to perform a test/debug input or output message operation.

Hierarchical Message Header 2722 comprises a Start field 1212, a Device ID field 1214, a Continuation Field 2715, a Group ID field 1404, and a Command field 1218. The Device ID field is used to select a first device (i.e. one of the devices 2704-2706 of system 2702). The Continuation field 2715 indicates that one or more second devices within the first device needs to be selected. The Group ID field 1404 is used to select a group of two or more second devices within the first device (i.e. two or more of the cores 2714 within of the first device 2704 or 2706). The Command field 1218 is used to load an instruction into the group device's test/debug messaging circuits 2006. This Hierarchical Message Header allows hierarchically selecting a group of devices within a device to commonly receive a test/debug input message.

Hierarchical Message Header 2724 comprises a Start field 1212, a Group ID field 1404, a Continuation Field 2715, a Device ID field 1204, and a Command field 1218. The Group ID field is used to select a group of devices (i.e. two or more of the devices 2704-2706 of system 2702). The Continuation field 2715 indicates that one or more second devices within each device of the group needs to be selected. The Device ID field is used to select the second device within the group of devices (i.e. a core 2714 within each device 2704-2706). The Command field 1218 is used to load an instruction into the second device's test/debug messaging circuit 2006. This Hierarchical Message Header allows hierarchically selecting a device within each device of a group to commonly receive a test/debug input message.

Hierarchical Message Header 2726 comprises a Start field 1212, a Group ID field 1404, a Continuation Field 2715, a Group ID field 1404, and a Command field 1218. The first Group ID field is used to select a first group of devices (i.e. two or more of the devices 2704-2706 of system 2702). The Continuation field 2715 indicates that a second group of devices within each device of the first group needs to be selected. The second Group ID field is used to select the second group of devices within the first group of devices (i.e. two or more selected cores 2714 within the first group of devices 2704-2706). The Command field 1218 is used to load an instruction into the second group of device's test/debug messaging circuits 2006. This Hierarchical Message Header allows hierarchically selecting a first group of devices then selecting a second group of devices within the first group to commonly receive a test/debug input message.

As seen in the dotted line of FIG. 27, if a second isolated power pad is available the Hierarchical Messaging scheme described above can use message signaling on both power pads as shown in FIGS. 10 and 18. Using two power pads, the previously described simultaneous test/debug message input and output operation of FIG. 17 can also be used to communicate to a hierarchically selected device.

While the example devices 2704-2706 of FIG. 27 have two levels of hierarchy, i.e. devices in the system and cores within the devices, the above described Hierarchical Message Headers can be used to access a device at any hierarchy level simply by continuing the use of the Continuation field 2715 to traverse the hierarchy.

Figure 28:
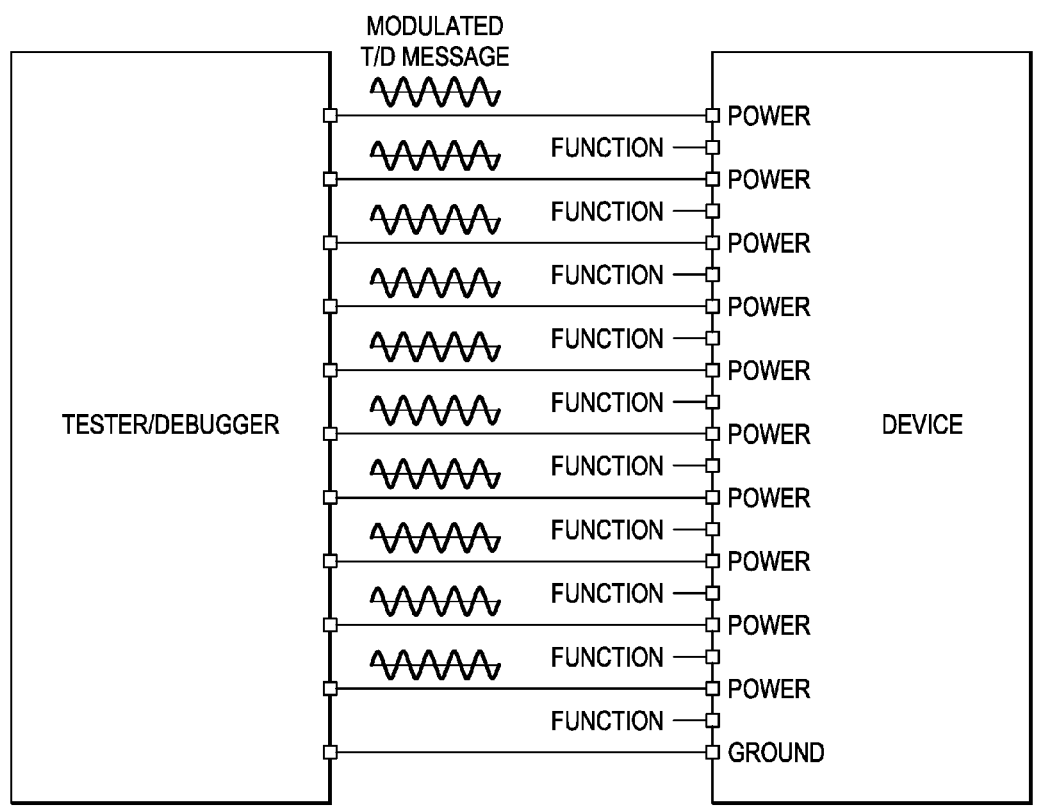
FIG. 28 illustrates a Tester/Debugger connected to a device via a plurality of power terminals for increasing the test/debug information bandwidth between the tester and device according to the present disclosure.

FIG. 28 is provided to illustrate that any number of isolated device power terminals may be used to transmit modulated test/debug messages between a tester/debugger and the device. Using multiple device power terminals facilitates device testing and debugging by increasing the amount of test and debug information that can be transferred between the tester/debugger and device, which results in lower device test and debug times and therefore reduced cost of device test and debug. For example a single power terminal may transmit X amount of test/debug information between the tester/debugger and device, whereas 10 power terminals may transmit 10× amount of test/debug information between the tester/debugger and device.

Although the present disclosure has been described in detail, it should be understood that various changes, substitutions and alterations may be made without departing from the spirit and scope of the disclosure as defined by the appended claims.

The general concept of "test" relating to an integrated circuit (IC) includes testing the functionality of the circuits of the IC, stressing the circuits of the IC during a burn-in process, and debugging the operation of a functionally tested and burned-in IC. Thus the word "test" in this application is not limited only to one of testing the functionality of the circuits, burn-in of the IC, and debugging the operation of an IC.

What is claimed is:

1. An integrated circuit comprising:
   A. a first power pad, a second power pad, and a ground pad;
   B. functional circuitry having functional input and output leads and having power and ground leads coupled to the power and ground pads;
   C. test circuitry having test leads connected to the functional circuitry and having a first device test lead and a second device test lead extending from the test circuitry, the first and second device test leads being free of the functional input and output leads;
   D. test messaging and control circuitry having a test input lead, a test output lead, and test circuitry leads connected to the first and second device test leads;
   E. demodulation circuitry having an input coupled to the first power pad and an output coupled to the test input lead of the test messaging and control circuitry; and
   F. modulation circuitry having an output coupled to the second power pad and an input coupled to the test output lead of the test messaging and control circuitry.

2. The integrated circuit of claim 1 including a capacitor connecting the input of the demodulation circuitry to the first power terminal.

3. The integrated circuit of claim 1 including a capacitor connecting the output of the modulation circuitry to the second power terminal.

* * * * *